(12) United States Patent
Bakalski

(10) Patent No.: US 10,193,521 B2
(45) Date of Patent: Jan. 29, 2019

(54) ADJUSTABLE IMPEDANCE MATCHING NETWORK

(71) Applicant: Infineon Technologies AG, Neubiberg (DE)

(72) Inventor: Winfried Bakalski, Munich (DE)

(73) Assignee: Infineon Technologies AG, Neubiberg (DE)

(*) Notice: Subject to any disclaimer, the term of this patent is extended or adjusted under 35 U.S.C. 154(b) by 69 days.

(21) Appl. No.: 14/874,718

(22) Filed: Oct. 5, 2015

(65) Prior Publication Data

US 2016/0099699 A1 Apr. 7, 2016

Related U.S. Application Data

(60) Division of application No. 13/626,851, filed on Sep. 25, 2012, now Pat. No. 9,184,722, which is a (Continued)

(51) Int. Cl.
*H01Q 1/50* (2006.01)
*H03H 7/38* (2006.01)
(Continued)

(52) U.S. Cl.
CPC .............. *H03H 7/38* (2013.01); *H01F 29/02* (2013.01); *H03H 7/0115* (2013.01); *H03H 7/40* (2013.01); *H04B 1/0458* (2013.01); *H03H 7/09* (2013.01)

(58) Field of Classification Search
CPC .. H01Q 1/50; H03H 7/09; H03H 7/38; H03H 7/40; H03H 7/0115
See application file for complete search history.

(56) References Cited

U.S. PATENT DOCUMENTS 4,058,769 A * 11/1977 Alderman ................ H03C 1/62
455/108
4,951,009 A    8/1990 Collins
(Continued)

FOREIGN PATENT DOCUMENTS

CN    101438459 A    5/2009
CN    101814903 A    8/2010
(Continued)

*Primary Examiner* — Hoang Nguyen
(74) *Attorney, Agent, or Firm* — Slater Matsil, LLP

(57) ABSTRACT

An impedance matching network includes a first terminal, a second terminal, and a reference potential terminal. The impedance matching network further includes a first shunt branch between the first terminal and the reference potential terminal, the first shunt branch including a capacitive element. The impedance matching network also includes a second shunt branch between the second terminal and the reference potential terminal, the second shunt branch including an inductive element. Furthermore, the impedance matching network includes a transmission line transformer with a first inductor path and a second inductor path, wherein the first inductor path connects the first terminal and the second terminal. An alternative impedance matching network includes a transformer and an adaptive matching network. The transformer is configured to transform an impedance connected to a first port so that a corresponding transformed impedance lies within a confined impedance region in a complex impedance plane.

21 Claims, 17 Drawing Sheets

Related U.S. Application Data continuation-in-part of application No. 13/371,001, filed on Feb. 10, 2012, now Pat. No. 9,166,640.

(51) Int. Cl.
  *H04B 1/04* (2006.01)
  *H01F 29/02* (2006.01)
  *H03H 7/40* (2006.01)
  *H03H 7/01* (2006.01)
  *H03H 7/09* (2006.01)

(56) References Cited

U.S. PATENT DOCUMENTS

| | | |
|---|---|---|
| 5,808,527 A | 9/1998 | De Los Santos |
| 5,874,926 A | 2/1999 | Tsuru et al. |
| 6,362,709 B1 | 3/2002 | Paxman et al. |
| 6,765,540 B2 * | 7/2004 | Toncich .............. G01R 27/2694 343/860 |
| 6,885,353 B2 | 4/2005 | Kurihara |
| 6,992,543 B2 | 1/2006 | Luetzelschwab et al. |
| 7,151,411 B2 | 12/2006 | Martin et al. |
| 7,831,219 B2 | 11/2010 | Heuermann et al. |
| 7,907,033 B2 | 3/2011 | Morris, III et al. |
| 8,164,387 B1 | 4/2012 | Apel et al. |
| 8,760,239 B2 | 6/2014 | Schmidhammer |
| 8,797,119 B2 | 8/2014 | Gu et al. |
| 8,836,602 B2 | 9/2014 | Hutcheson |
| 2003/0030504 A1 | 2/2003 | Dixit et al. |
| 2004/0251984 A1 | 12/2004 | Javor |
| 2006/0077107 A1 * | 4/2006 | Kim ....................... H01Q 1/243 343/702 |
| 2007/0176686 A1 * | 8/2007 | Fu ........................... H03F 1/342 330/294 |
| 2010/0030504 A1 | 2/2010 | Simpson |
| 2010/0085129 A1 | 4/2010 | Shuto et al. |
| 2010/0164645 A1 | 7/2010 | Kobayashi et al. |
| 2011/0075449 A1 | 3/2011 | Fouquet |
| 2011/0163935 A1 * | 7/2011 | de Jongh ................ H03H 7/40 343/861 |
| 2012/0206215 A1 | 8/2012 | Winslow |
| 2014/0049442 A1 | 2/2014 | Yen et al. |

FOREIGN PATENT DOCUMENTS

| | | |
|---|---|---|
| CN | 101917166 A | 12/2010 |
| DE | 3644476 A1 | 7/1988 |
| DE | 69023417 T2 | 5/1996 |
| DE | 19644339 C1 | 6/1998 |
| DE | 19945662 A1 | 4/2001 |
| DE | 10063606 A1 | 7/2001 |
| DE | 102005058875 A1 | 6/2007 |

* cited by examiner

FIG 11
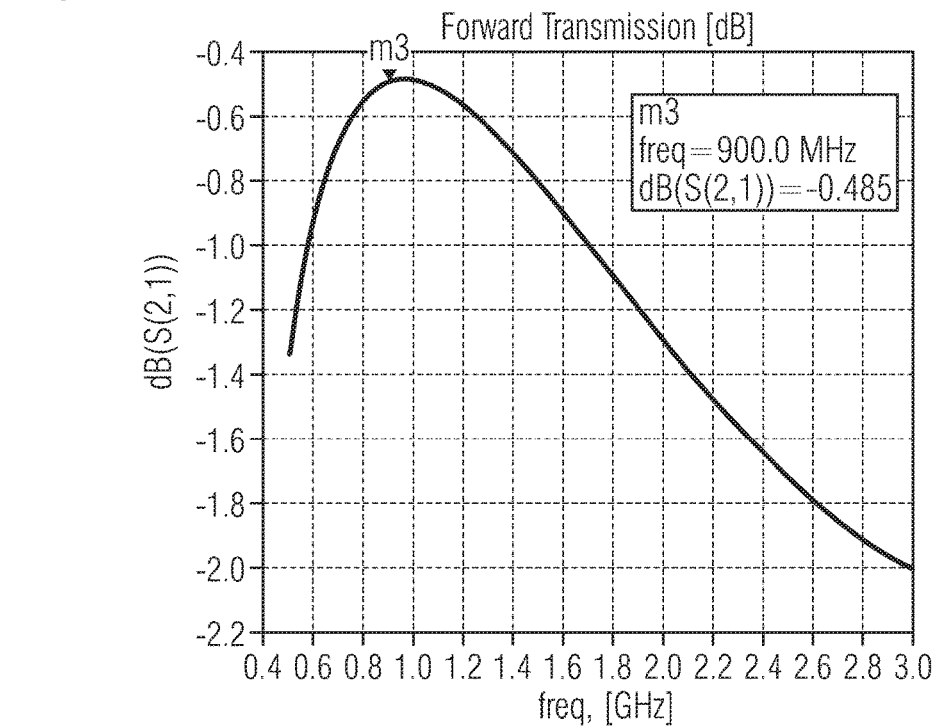
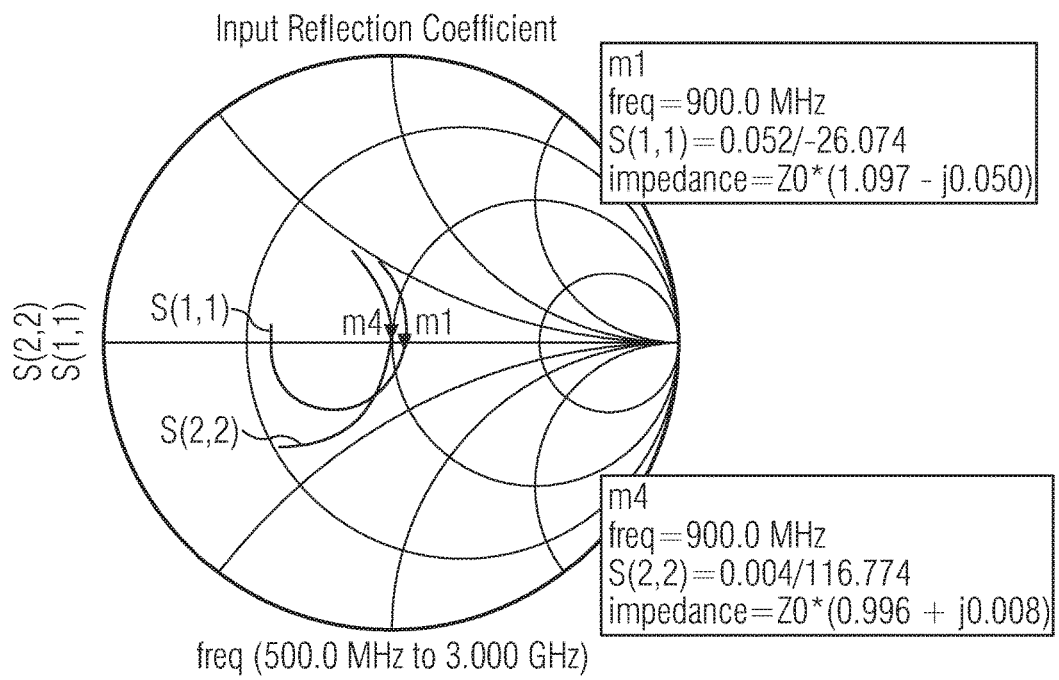

REAL PART
OF IMPEDANCE
TO BE MATCHED

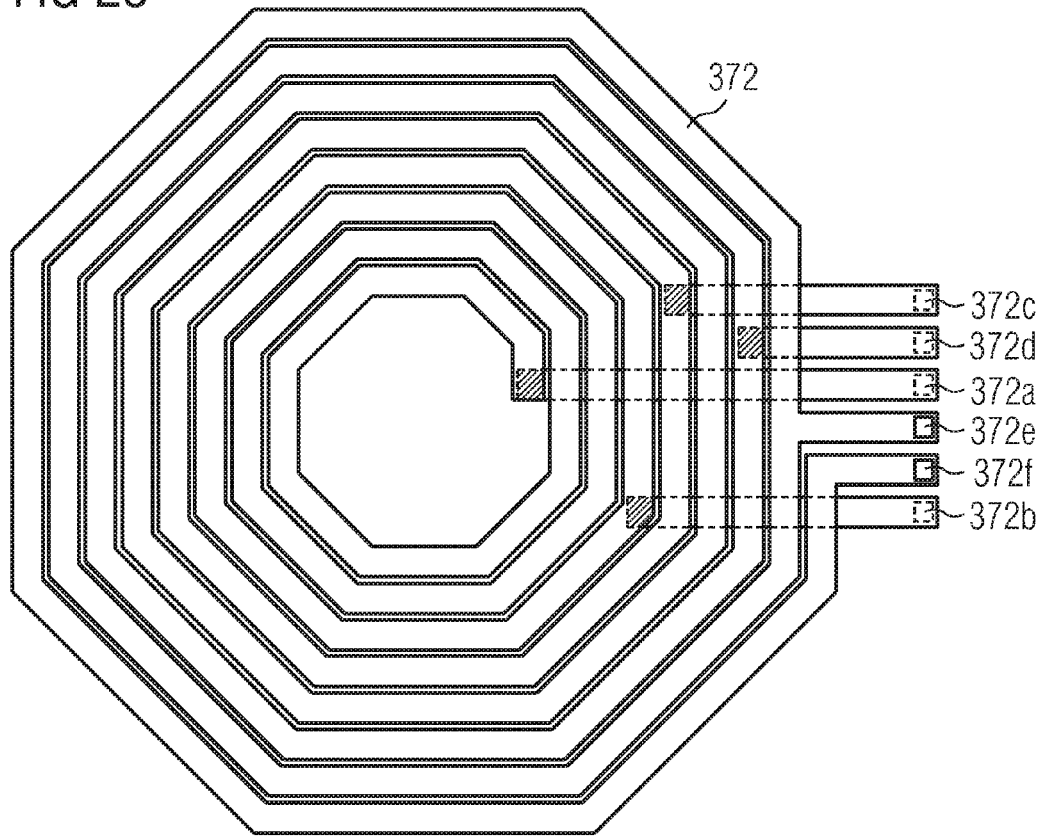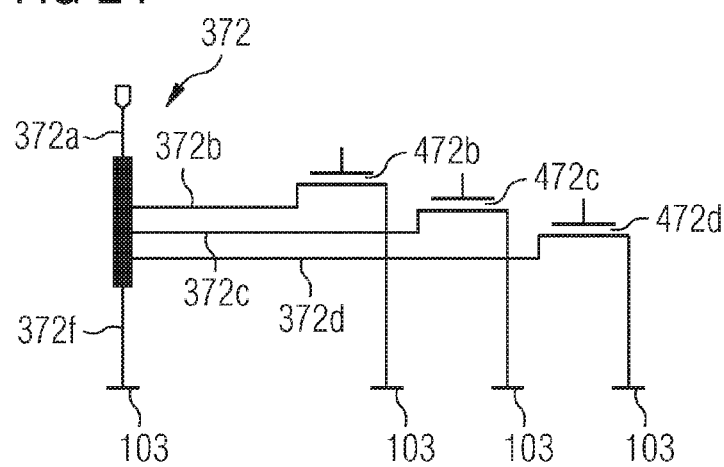

FIG 31

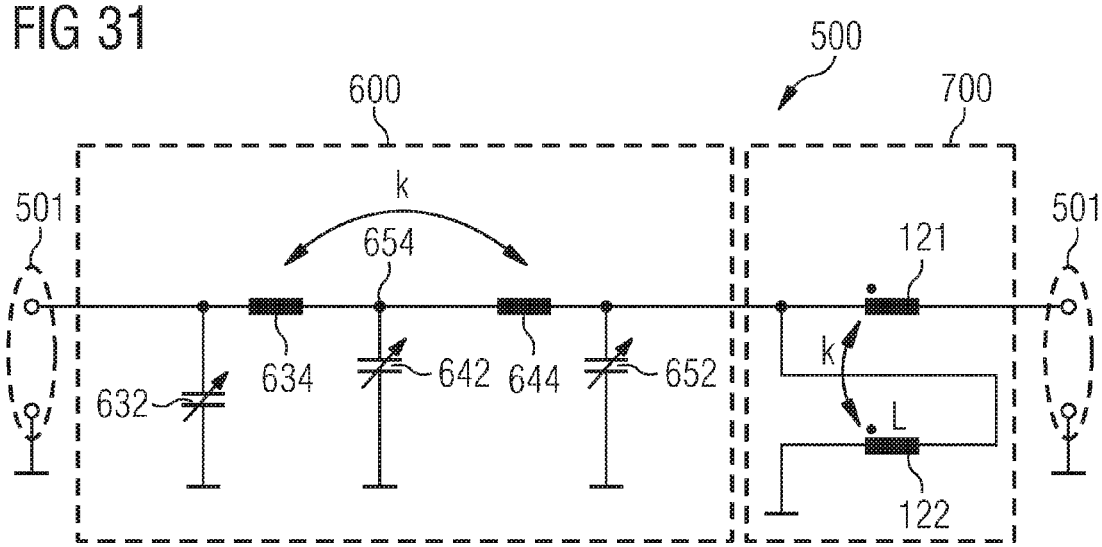

FIG 32

| adjusting a real part of the impedance by adjusting a transmission ratio of the transmission line transformer | ~902 |

↓

| adjusting an imaginary part of the impedance by adjusting at least one of the capacitive element and the inductive element | ~904 |

FIG 33

| transforming the impedance to a corresponding transformed impedance that lies within a confined impedance region in a complex impedance plane, wherein said transforming is performed by transformer of the impedance matching network | ~952 |

↓

| matching the transformed impedance located anywhere within the confined impedance region to a second impedance connected to a second port of the impedance matching network, wherein said matching is performed by an adaptive matching network | ~954 |

ADJUSTABLE IMPEDANCE MATCHING NETWORK

This is a divisional application of U.S. application Ser. No. 13/626,851, entitled "Adjustable Impedance Matching Network" which was filed on Sep. 25, 2012 which is a continuation-in-part of U.S. application Ser. No. 13/371,001, entitled "Adjustable Impedance Matching Network" which was filed on Feb. 10, 2012, both of which are incorporated herein by reference.

TECHNICAL FIELD

Embodiments of the present invention relate to an impedance matching network. Further embodiments of the present invention relate to a method for matching an impedance. Further embodiments of the present invention relate to an antenna circuit. Further embodiments of the present invention relates to a monolithically, fully integratable matching network with broad impedance range. Further embodiments of the present invention relate to an adaptive matching circuit with pre-transformation.

BACKGROUND

In electrical or electronic systems, it is often desirable to design the input impedance of an electrical load (or the output impedance of a source of electrical energy) to maximize the power transfer and/or minimize reflections from the load. Maximum power transfer is typically obtained when the load impedance is equal to the complex conjugate of the source impedance. In contrast, minimum reflection can typically be achieved when the load impedance is equal to the source impedance.

Current radio frequency (RF) or high-frequency (HF) front end systems typically still comprise, at the transmitter end, a power amplifier (PA) for amplifying the signal to the required level, a filter (typically a harmonic filter), a power detector, and an antenna switch that performs a switching between the transmission bands, the reception bands, as well as between transmitter operation and receiver operation. Thereafter the signal is typically forwarded via an antenna impedance matching network to the antenna.

This antenna impedance matching is designed that, averaged over all use cases, frequencies and operating modes, as well as over their respective probabilities, an optimum is achieved. As can readily be seen, the optimum is only reached very seldom, because the frequency spectrum of the mobile communications frequencies constantly becomes broader and also the antenna itself provides very different matching for all frequencies and environmental conditions that may occur.

SUMMARY OF THE INVENTION

Embodiments of the present invention provide an impedance matching network comprising a first terminal, a second terminal, a reference potential terminal, a first shunt branch, a second shunt branch, and a transmission line transformer. The first shunt branch extends between the first terminal and the reference potential terminal. The first shunt branch comprises a capacitive element. The second shunt branch extends between the second terminal and the reference potential terminal. The second shunt branch comprises an inductive element. The transmission line transformer comprises a first inductor path and a second inductor path, where in the first inductor path connects the first terminal and the second terminal.

Further embodiments of the present invention provide an impedance matching network comprising a first port, a second port, a transformer, and an adaptive matching network. The transformer is configured to transform an impedance connected to the first port so that a corresponding transformed impedance lies within a confined impedance region in a complex impedance plane. The adaptive matching network is at adjustable to match the transformed impedance located anywhere within the confines in ketones region to a second impedance connected to the second port.

According to further embodiments, an antenna circuit comprises an antenna, a signal terminal configured to relay a signal to a receiver or from a transmitter, and an impedance matching network. The impedance matching network interconnect the antenna and the signal terminal and comprises a Pi-network having a first inductor path of a transmission line transformer in a series branch of the Pi-network.

According to further embodiments, an antenna circuit comprises an antenna, a signal terminal configured to relay a signal to a receiver or from a transmitter, and an impedance matching network interconnecting the antenna and the signal terminal. The impedance matching network comprises a transformer configured to transform an impedance connected to the first port so that a corresponding transformed impedance lies within a confined impedance region in a complex impedance plane. The impedance matching network further comprises an adaptive matching network that is adjustable to match the transformed impedance located anywhere within the confined impedance region to a second impedance connected to the second port.

Further embodiments of the present invention provide a method for matching an impedance using an impedance matching network that comprises a first shunt branch with a capacitive element, a second shunt branch with an inductive element, and a transmission line transformer with a first inductor path and a second inductor path. The first inductor path (inter-) connects the first terminal and the second terminal. The method comprises at adjusting a real part of the impedance by adjusting a transmission ratio of the transmission line transformer. The method further comprises at adjusting an imaginary part of the impedance by adjusting at least one of the capacitance element and the inductive element.

According to further embodiments of the present invention a method for matching an impedance connected to a first port of an impedance matching network is provided. The method comprises transforming the impedance to a corresponding transformed impedance that lies within a confined impedance region in a complex impedance plane. This transforming is performed by (or using) a transformer of the impedance matching network. The method also comprises matching the transformed impedance located anywhere within the confined impedance region to a second impedance connected to a second port off the impedance matching network. This matching is performed by an adaptive matching network or using an adaptive matching network.

BRIEF DESCRIPTION OF THE DRAWINGS

Embodiments of the present invention are described herein, making reference to the appended drawings.

FIG. 11 shows a graph illustrating the forward transmission over frequency of the Pi-network with Ruthroff transformer shown in FIG. 10, and a Smith chart illustrating the input and output reflection coefficients thereof as a function of frequency;

FIG. 23 shows a schematic top view of an inductive element with taps that may be used in the inductive shunt branch;

FIG. 24 shows a schematic circuit diagram of an adjustable inductive element with taps that may be used in the inductive shunt branch;

FIG. 31 shows a schematic circuit diagram of an impedance matching network having a transformer for pre-transformation;

FIG. 32 shows a schematic flow diagram of a method for matching an impedance using an impedance matching Pi-network with a transmission line transformer in the series branch; and FIG. 33 shows a schematic flow diagram of a method for matching an impedance using an impedance matching network having a transformer for performing a pre-transformation.

Equal or equivalent elements or elements with equal or equivalent functionality are denoted in the following description by equal or similar reference numerals.

DETAILED DESCRIPTION OF ILLUSTRATIVE EMBODIMENTS

In the following description, a plurality of details is set forth to provide a more thorough explanation of the embodiments of the present invention. However, it will be apparent to one skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

Figure 1:
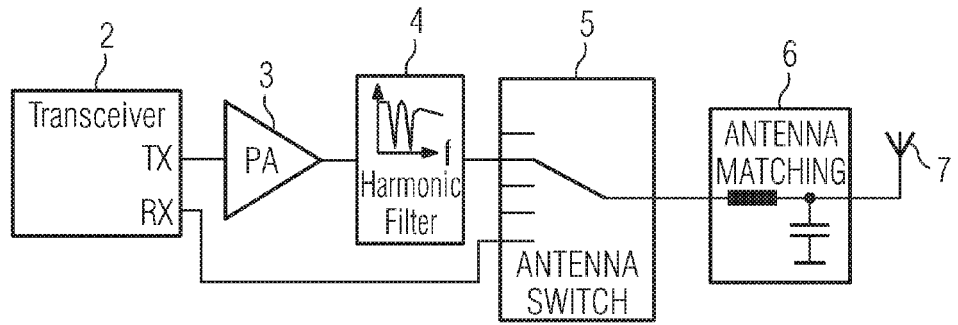
FIG. 1 shows a schematic block diagram of an RF or HF frontend system according to the state of the art.

FIG. 1 shows a schematic block diagram of a simplified radio frequency (RF) or high-frequency (HF) frontend system as it may be used, for example, in a mobile station or a base station of a mobile communications network, such as a cell phone, a smart phone, a tablet computer, an USB wireless modem, a wireless router, or a base transceiver station. The front end system comprises a transceiver 2, a power amplifier (PA) 3, a harmonic filter 4, an antenna switch, an antenna matching network 6, and an antenna 7. When functioning in a transmitter operating mode, the transceiver 2 provides a transmit signal at its output TX to the power amplifier 3. An amplified transmit signal provided by the power amplifier 3 is fed to the harmonic filter 4, which reduces frequency components of the amplified transmit signal outside an intended transmit frequency range. An output of the harmonic filter 4 is connected to one of the plurality of inputs of the antenna switch 5. In the example of FIG. 1, the antenna switch 5 is currently configured to connect said input to an antenna switch output. The other inputs of the antenna switch 5 may be connected to respective outputs of further harmonic filters (not illustrated in FIG. 1) having a different frequency response than the harmonic filter 4 so that the HF frontend system illustrated in FIG. 1 may be configured to support several transmit frequencies and/or several mobile communications standards. The antenna switch 5 is further configured to connect the antenna matching network 6 with an RX input (i.e., a receiver input) of the transceiver 2 via a connection 8, when the HF frontend system operates in a receiver mode.

The antenna switch output is connected to an input of the antenna matching network 6. The antenna matching network 6 is, in the illustrated example, implemented as a basic LC network comprising a series inductance and a capacitance connected in parallel to an output of the antenna matching network 6 (i.e., a "shunt capacitance"). The output of the antenna matching network 6 is connected to the antenna 7.

As the HF frontend system can be reconfigured by means of the antenna switch 5 to support several frequencies, mobile communications standards, and/or further parameters related to the transmission or reception of radio signals, the antenna matching network 6 has to be selected taking into account the various possible use cases, frequencies and operating modes, as well as their respective probabilities in order to provide a weighted optimum. This task becomes more and more difficult, because the frequency spectrum of the mobile communications frequencies is getting wider and wider and also the antenna itself requires different impedance matching settings for different environmental conditions. In addition, the problem of antenna mismatch due to the different environment of the antenna has to be considered. For example, the impedance of an antenna may vary very strongly, when the antenna is being touched by, e.g., a finger of a mobile phone user, as could be observed with some mobile phone models sold in the past. Moreover, a mismatch leads to additional non-linearities at the power amplifier 3 and to a modification of the filter behavior of the harmonic filter 4, because the mismatch is passed through the antenna switch 5. In consequence, the overall system is negatively affected at several points by the mismatch. These problems are more exactly considered only recently, because mobile communications systems used to be specified for 50 Ohm measuring systems, only.

Figure 2:
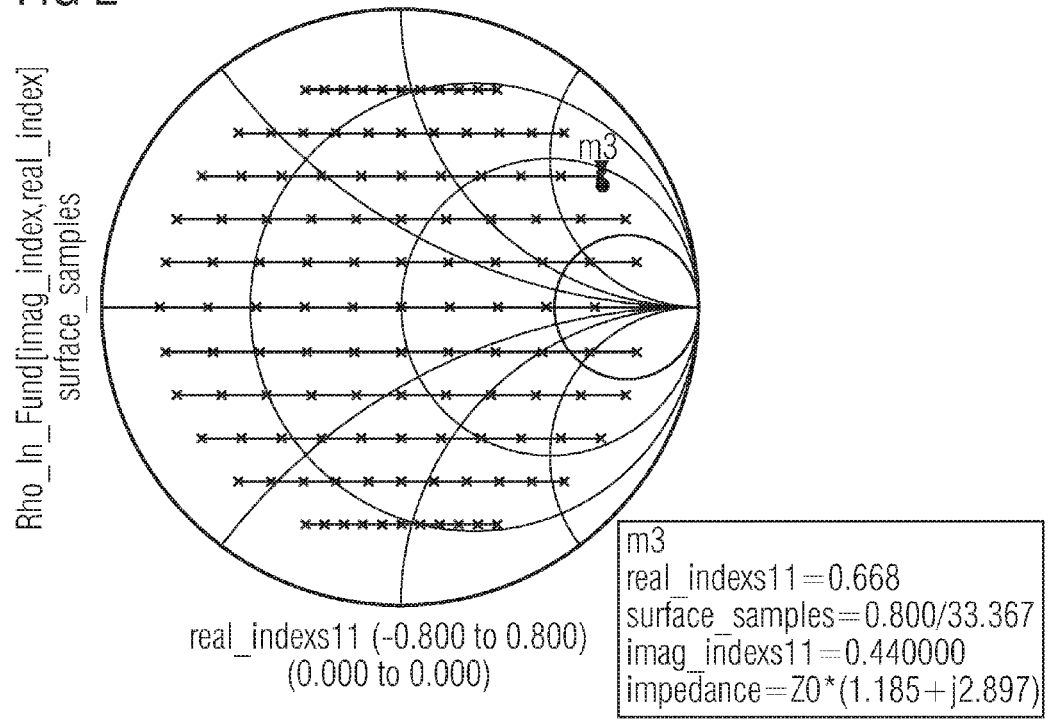
FIG. 2 shows a Smith chart illustrating a plurality of test cases for a mismatch test as required by some mobile communications standards.

For some time past, additional requirements with respect to the total radiated power (TRP) exist, which have to be fulfilled by mobile communications devices for specific network providers. This means that for a wide range of mismatches the system has to reach the required radiated power. A mismatch occurs if the antenna impedance differs from the source impedance, e.g., the output impedance of the antenna switch 5 in FIG. 1. FIG. 2 schematically illustrates a selection of different antenna impedances that have may occur during the operation of a wireless communications device in a Smith chart and hence may lead to a mismatch. Note that the possible impedances are located in a confined region centered to the origin of the Smith chart. An outer ring of the Smith chart plane does not contain any impedance values to be considered, i.e., the corresponding impedance region is not considered as very likely to occur during normal operation. Indeed, the outer ring of the Smith chart corresponds to impedances that differ significantly from a reference impedance $Z_0$ (e.g., 50 ohm) which is located at the center of the Smith chart, and are therefore rather unlikely to occur.

In other words, FIG. 2 illustrates a plurality of test cases in a Smith chart representation that a HF or RF frontend system has to pass in order to be admitted for operation in certain mobile communications networks. In particular, FIG. 2 shows the possible impedance inside a circle of a given VSWR (Voltage Standing Wave Ratio), here for VSWR=10. Thus, every mismatch below VSWR=10 may be a valid point, and as this can be infinite much, the amount of points is limited to 121 (11 lines with each line having 11 points) for the purpose of illustration in FIG. 2.

It can be expected that simple arrangements might not be sufficient in the future for meeting current and future requirements. For this reason, switchable matching networks are currently used in some first devices, where in accordance with the frequency being used a modification of the matching is performed.

Figure 3:
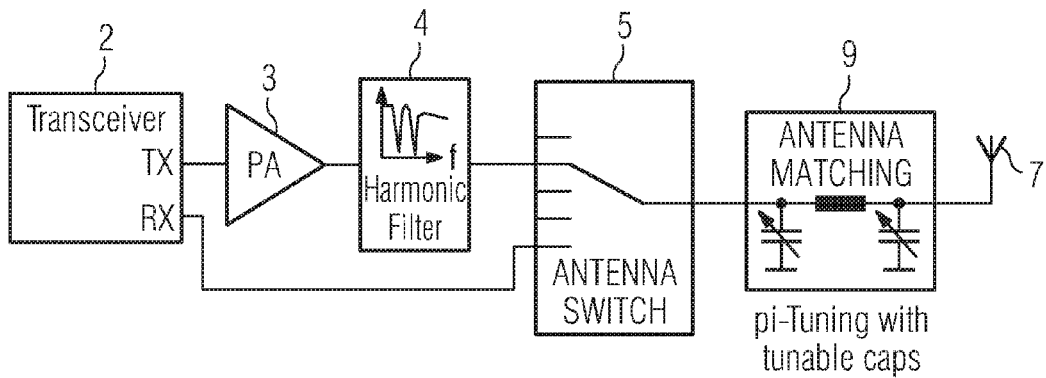
FIG. 3 shows a schematic block diagram of an RF or HF front end system according to the state of the art comprising a tunable Pi-network for antenna matching.

FIG. 3 illustrates a schematic block diagram of an HF front end system comprising an adjustable antenna matching network 9. The adjustable antenna matching network 9 is in the example illustrated in FIG. 3 configured as a Pi-network with tunable capacitances connected in parallel to the input and the output, respectively.

Figure 4:
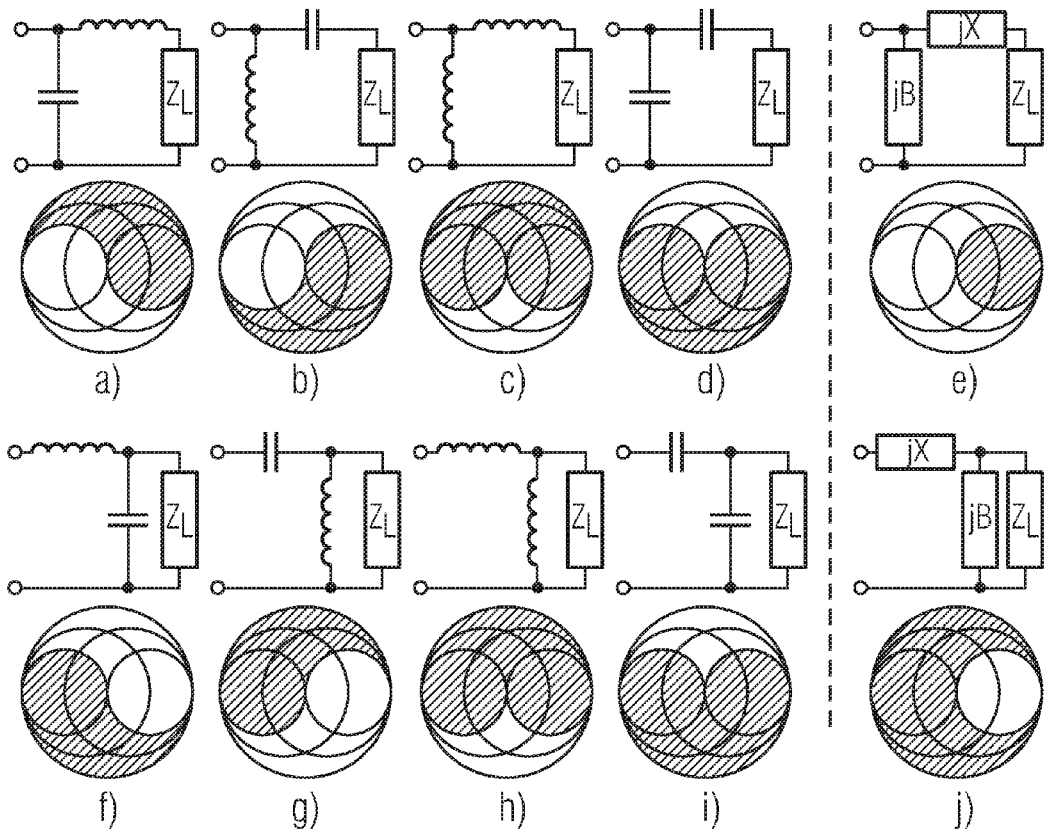
FIG. 4 illustrates a plurality of basic LC networks and their corresponding "forbidden regions" in the Smith chart plane.

With respect to the impedance matching network, it has to be considered that with a given impedance matching network topology not every impedance may be realized, i.e., there are so called "forbidden regions." FIG. 4 illustrates some basic LC networks and below each basic LC network a corresponding schematic Smith diagram in which the forbidden region is represented as a hatched region. A load impedance $Z_L$ is connected to the various LC basic networks.

In order to cover a wide range of possible impedances, adjustable impedance matching networks typically have a Pi-topology (Π-topology) or a T-topology. A Pi-topology having a series inductance, a parallel input capacitance, and a parallel output capacitance forms a low pass filter which attenuates harmonics generation. Furthermore, variable capacitances are available (rotary capacitor, BSR capacitor (i.e., $(Ba,Sr)RuO_3$ capacitor) . . . ), whereas a variable inductance typically requires a variable tap.

Figure 5:
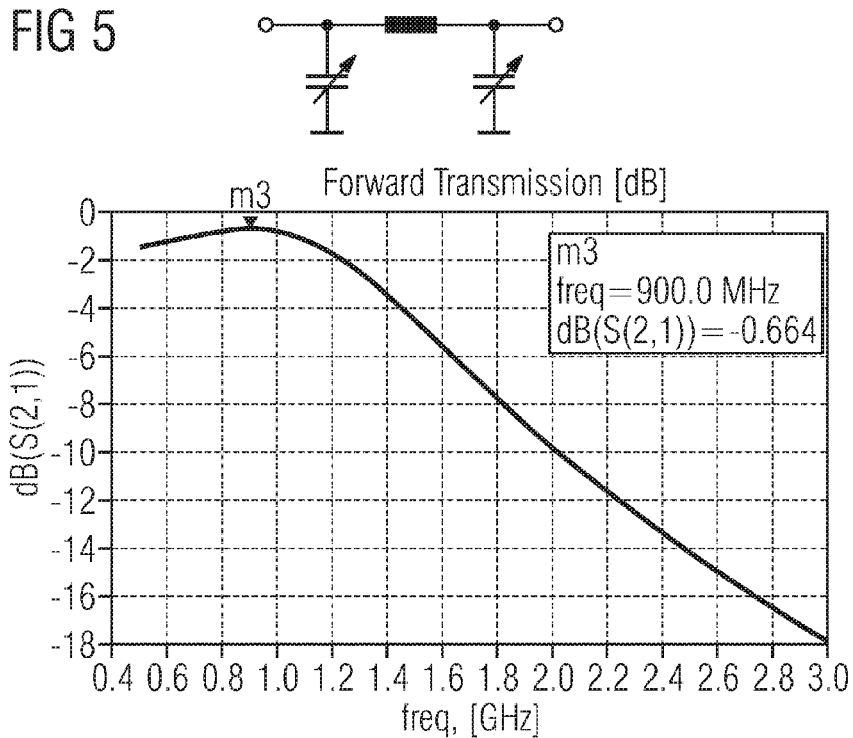
FIG. 5 shows a tunable Pi-network, a graph illustrating the forward transmission of the Pi-network over frequency, and a Smith chart illustrating the input and output reflection coefficients as a function of frequency.
Figure 6:
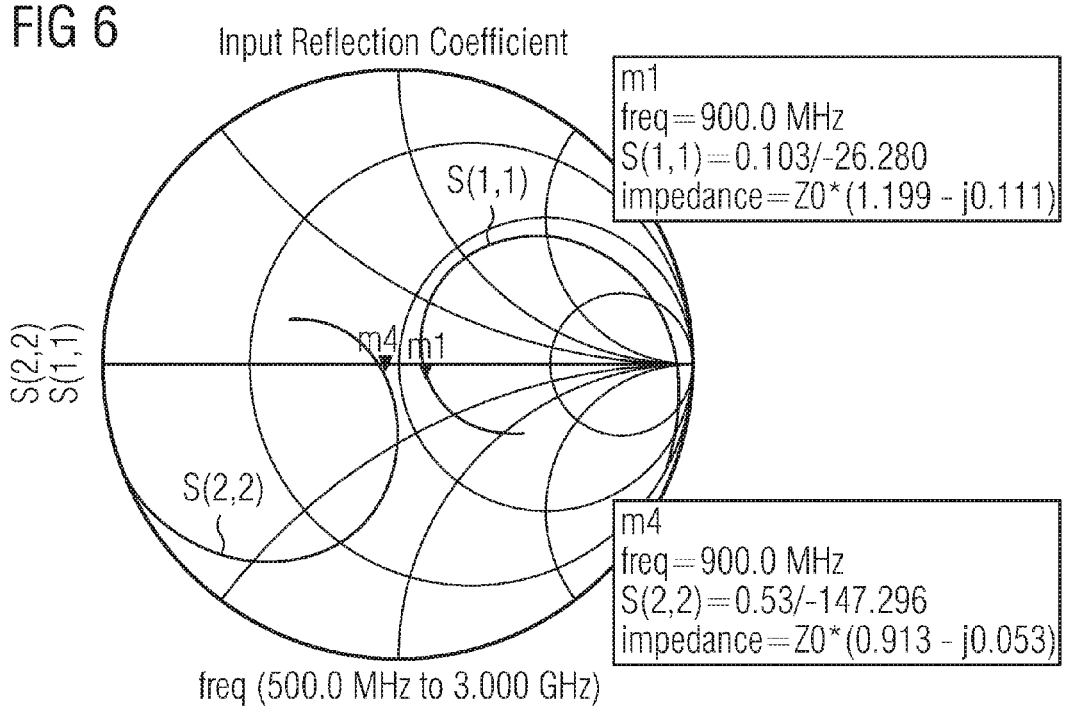
FIG. 6 shows a graph illustrating the forward transmission over frequency of the Pi-network from FIG. 5, and a Smith chart illustrating the input and output reflection coefficients as a function of frequency.

FIG. 5 schematically illustrates a Pi-topology of an adjustable impedance matching network. FIG. 6 illustrates a corresponding diagram of the forward transmission S(2,1) over frequency, and a Smith chart of the input reflection coefficient S(1,1) and the output reflection coefficient S(2,2) as a function of the frequency. An impedance of 12.5 ohms shall be matched to an impedance of 50 ohms. The target frequency is 900 MHz. The Pi-structure is illustrated in FIG. 5. The series inductance of the Pi-structure is 4 nH with a series resistance of 2 ohms. The upper diagram illustrates the insertion loss S(2,1), and the Smith chart in the lower part of FIG. 6 illustrates the input reflection coefficient S(1,1) as a full stroke line, and the output reflection coefficient S(2,2) as a dashed line.

Figure 7:
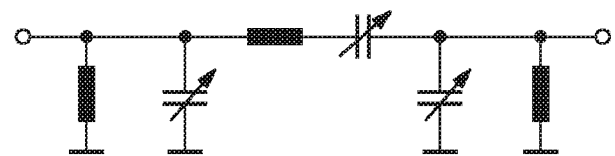
FIG. 7 shows a schematic circuit diagram of a Pi-network having three adjustable capacitive elements and three fixed value inductive elements.

FIG. 7 shows a schematic circuit diagram of an adjustable Pi-network comprising three adjustable capacitive elements and three constant inductive elements (of fixed inductance value). In comparison to the network structure of FIG. 5, the network structure of FIG. 7 makes it possible to cover a larger range of the voltage standing wave ratio (VSWR) and also to cover a larger frequency range.

With a network having a Pi-structure, typically only the capacitances are adjusted, whereas the inductance is fixed and should have a high quality factor.

The problem of the Pi-structure is that typically only the capacitances are varied, whereas the inductance is constant and is required to have a high figure of merit or quality factor. In the case in which no matching has to be performed, that is 50 ohms are matched to 50 ohms, the circuit functions as a pure phase shifter. As can be seen when examining the circuit illustrated in FIG. 5, losses occur in this situation, i.e., it would be desirable to bridge the inductance. In cases in which it is not possible to bridge the inductance, an adjustable capacitance may be series-connected in order to reduce the effective series inductance. Unfortunately, this very action inevitably leads to a loss off quality factor, i.e., the imaginary part becomes smaller but the series resistance remains constant, at best (typically it even increases). Hence, the topologies illustrated in FIGS. 5 and 7 form narrowband systems of first order, i.e., a good matching can be achieved in a very small frequency range only, or, alternatively, in a broader frequency range by accepting inferior figures of merit/quality factors, resulting in higher losses. For this reason, broadband solutions requiring as few components as possible, and/or possibly monolithically integratable, would be desirable.

Figure 8:
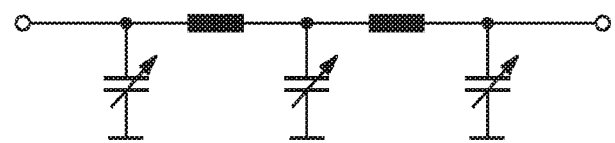
FIG. 8 shows a schematic circuit diagram of a multistage matching network comprising three adjustable capacitive elements and two fixed value inductive elements.

This basically means that a multistage matching structure is chosen, as shown in FIG. 8, which obviously leads to several matching elements, or that a transformer is used. Particularly for impedance transformations in the real plane so-called Guanella or Ruthroff transformers are known in the literature. While these historically were implemented as macroscopic transformers with bifilar windings, they may also be realized as planar transformers on or within a printed circuit board, a silicon substrate, or a laminated structure.

Figure 9:
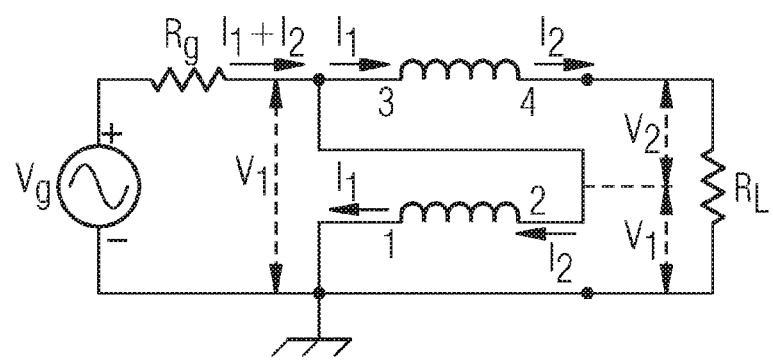
FIG. 9 shows a circuit schematic of a Ruthroff transformer connected to a voltage source, a source impedance, and a load impedance.

As an example, FIG. 9 shows a circuit schematic of a Ruthroff transformer functioning as a 1:4 impedance transformer which is assumed to have two identical inductances. The basic idea of these transformers is the combination of signal portions in an additive manner. In the case illustrated in FIG. 9, the output voltage is a sum of the voltage V2 across the series inductance and of the voltage V1 across the ground path. At the same time, the electric current is split up over the two inductances so that, due to a doubling of voltage and a halving of the electric current, an impedance transformation of 1:4 is achieved ($R_L$ appears to be more high-ohmic to the voltage source $V_g$).

Figure 10:
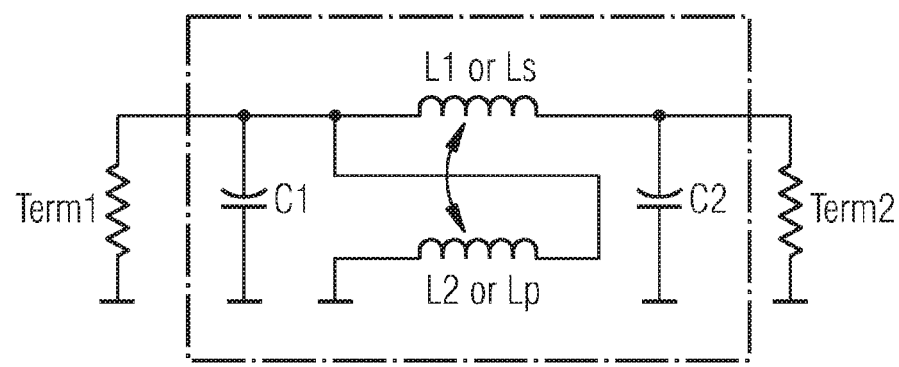
FIG. 10 shows a Pi-network comprising a Ruthroff transformer.

FIG. 10 shows a 4:1 Ruthroff transformer structure within a Pi-network. FIG. 11 shows a diagram of the forward transmission coefficient as a function of frequency, and a Smith chart of the input reflection coefficient S(1,1) and the output reflection coefficient S(2,2). The series inductance between the nodes 3 and 4 is $L_S$=4 nH and has a series resistance of 2 ohms. The inductance in the path to ground is substantially equal, i.e., $L_P$=4 nH with a series resistance of 2 ohms. The parallel input capacitance is Cs1=3.4 pF and the parallel output capacitance is Cs2=2 pF. The magnetic coupling factor between the series inductance and of the ground path inductance is k=0.8. Again, a small signal simulation (S parameters) has been performed and shows the behavior illustrated in the diagrams of FIG. 8. The solution using a transformer typically has the following characteristics in comparison to, for example, a solution using a (classical) Pi-structure as shown in FIG. 5. For the sake of comparison, the same degree of matching as in FIG. 6 is desired, namely matching of 12.5 ohms to 50 ohms. The target frequency is 900 MHz. As can be seen in the upper diagram of FIG. 11 illustrating the forward transmission factor as a function of the frequency, a smaller insertion loss can be achieved using an identical series inductance having an identical figure of merit/quality factor. In particular, the Pi-structure shown in FIG. 5 produced an instruction loss of approximately 0.66 dB, whereas the impedance matching network using a Ruthroff transformer illustrated in FIG. 10 has an insertion loss of only 0.49 dB. This is a difference of 0.15 dB, even though an additional second inductance having the same figure of merit/quality factor is involved.

The comparison of the input reflection coefficients S(1,1) and of the S(2,1) curve of the Pi-structure shown in FIG. 6 with the same curves of the Ruthroff transformer structure shown in FIG. 11 further reveals that the transformer solution also offers an improved bandwidth behavior, in particular a broader bandwidth. While the Pi-network of FIG. 5 has an attenuation of already 18 dB at 3 GHz (see forward transmission factor diagram in FIG. 6), an attenuation of only 2 dB can be achieved using the transformer-implemented impedance matching network as illustrated in FIG. 10, as can be seen in the forward transmission factor diagram of FIG. 11. This is of particular interest with respect to production tolerances, because narrowband systems might lead to yield problems.

Figure 12:
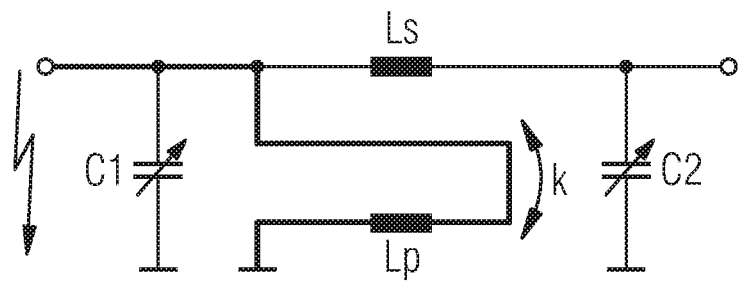
FIG. 12 illustrates a main electrostatic (overcurrent) discharge path within a Pi-network comprising a Ruthroff transformer.

The transformer structure shown in FIG. 10 further provides an additional electrostatic discharge (ESD) protection, as illustrated in FIG. 12. While sensible capacitances of the Pi-structure in FIG. 5 have to sustain an ESD pulse primarily on their own (which typically is not possible, or at least difficult to implement, using silicon-based integrated circuit), the capacitance within the transformer-implemented structure is protected by the inductance $L_P$. The discharge current path is indicated in FIG. 12 as a thick line. Another feature of the transformer-implemented impedance matching network that may be of interest for adaptive matching, will be described below in more detail: by nature, the voltages split up over the two inductances of the transmission line transformer (Ruthroff transformer).

Figure 13:
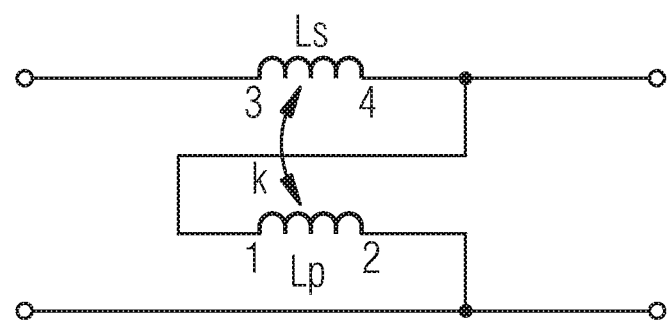
FIG. 13 shows a circuit schematic of a Ruthroff transformer in a second configuration.

By choosing different inductances for the series inductance $L_S$ and the ground path inductance $L_P$, transformation factors other than 1:4 may be implemented. Furthermore, it is possible to invert one of the inductances in order to convert the 1:4 transformer into a 4:1 transformer. Conveniently, it is not necessary to change or reconnect the series inductance $L_S$ for such reconfiguration of the Ruthroff transformer, but it is sufficient to "turn around" the ground path $L_P$. In the circuit schematic shown in FIG. 13 the ground path inductance $L_P$ is inverted in comparison to the configuration of the Ruthroff transformer shown in FIG. 9, because node 1 of the ground path inductance $L_P$ is now connected to node 4 of the series inductance $L_S$, while node 2 of the ground path inductance $L_P$ is connected to the ground potential. The connection of the series inductance $L_S$ is the same in FIG. 9 and in FIG. 13.

In order to obtain an adjustable impedance transformation, it is possible to either switch the series inductance $L_S$ or the ground path inductance $L_P$. Reactive components, such as inductive or capacitive components, may then be adjusted as in the original approach using variable capacitances C1 and C2, as illustrated in FIG. 10. FIG. 10 shows a circuit schematic of an adjustable impedance matching network according to at least one embodiment.

Figure 14:
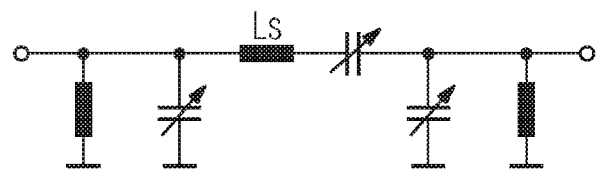
FIG. 14 shows a schematic circuit diagram of a Pi-network with an inductive element and an adjustable capacitive element in the series branch.

One further challenge that may need to be overcome is the need to adjust the imaginary part/reactive component. While the capacitive portion can be adjusted in a relatively simple manner using (adjustable) capacitors against ground, the classical approach for impedance matching using a Pi-network is a series inductivity $L_s$, as schematically illustrated in the circuit schematic of FIG. 14. Actually, the series inductivity $L_s$ is fixed and an adjustable capacitor is connected in series with the series inductivity $L_s$ in order to change the inductance of the series branch of the Pi-network.

Figure 15:
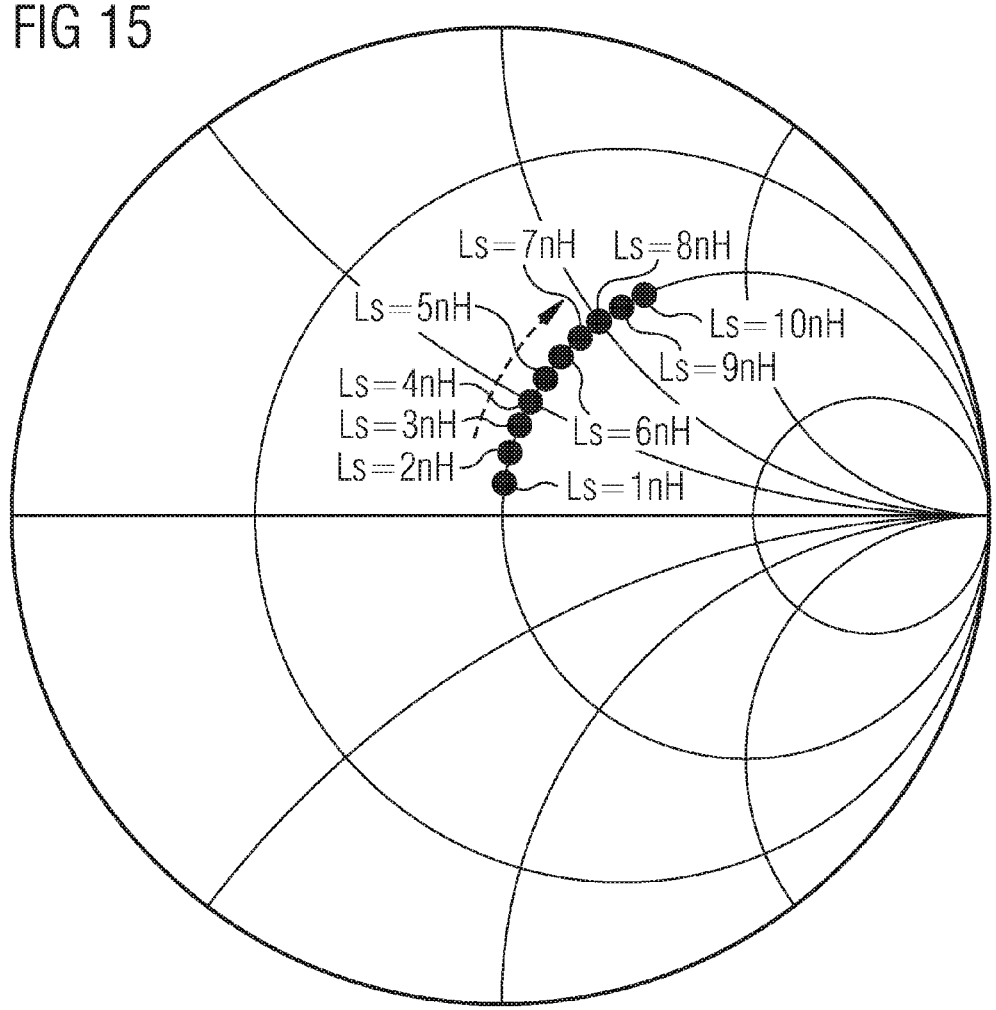
FIG. 15 illustrates how the impedance of the Pi-network in FIG. 13 changes as a function of the inductance in the series branch.

FIG. 15 shows in a Smith chart how the impedance of a series inductivity changes with increasing inductance. A very small inductance (L≈0) behaves much like a short circuit so that the input impedance (or overall impedance) of a network comprising the series inductivity (i.e., substantially a short circuit for a small inductance) and a load impedance is equal to the load impedance. The corresponding point in the Smith chart is at or very close to the center of the Smith chart at (1,0). With increasing inductance of the series inductivity, the input impedance becomes increasingly inductive. In FIG. 15, the inductance is varied between 1 nH and 10 nH.

Furthermore, the quality factor of an adjustable series inductivity typically has to be taken into account. In case the adjustability of the adjustable inductivity is actually performed by a series connected adjustable capacitance, the imaginary part is automatically reduced, while the series resistance remains substantially constant, which leads to a reduction of the quality factor. In addition, losses caused by the capacitance itself and/or by a switch (in case such a switch is used, e.g., a CMOS switch) may further degrade the quality factor. A slightly better way would then be to either switch or commutate several coils (inductivities) or to design one coil with one or more taps, with which the inductivity can be adjusted. The provision of several coils leads to higher costs and space requirements. A coil with tap(s) typically requires a corresponding buildup technology, such as LTCC (low temperature co-fired ceramic) or monolithic integration. For this reason, this approach is typically not found with laminate modules, inter alia because taps are simply too big due to the required vias and due to other parameters.

No matter which approach is chosen, one has to accept significant additional losses. Moreover, ESD-related issues may arise that are caused by the capacitance or capacitances, in particular if the capacitance is a shunt capacitance. Therefore, another way appears to be more appropriate, namely the use of an inductivity against ground, i.e., a "shunt L."

Figure 16:
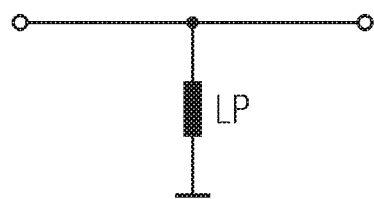
FIG. 16 shows a schematic circuit diagram of an inductive shunt element ("shunt L")
Figure 17:
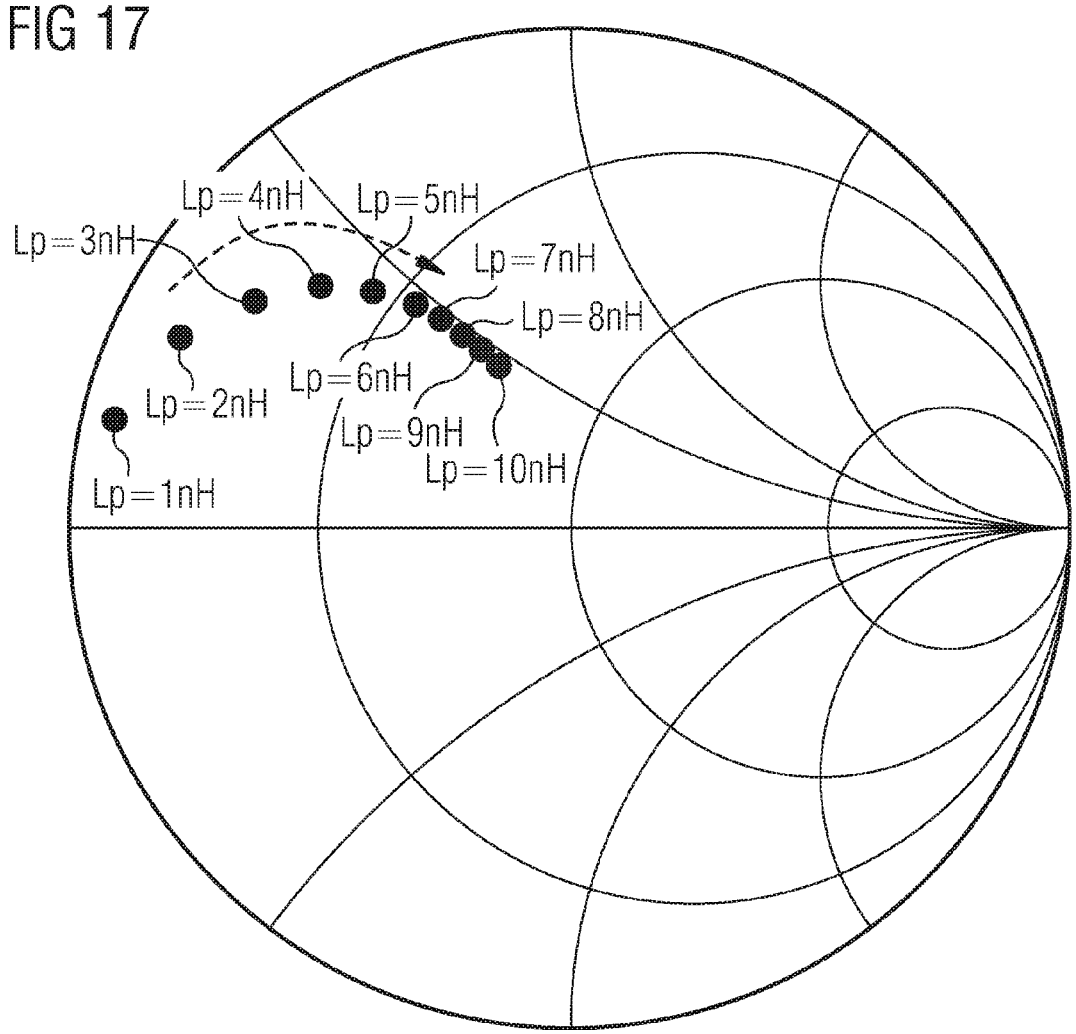
FIG. 17 illustrates how the impedance of the inductive shunt element in FIG. 15.

FIG. 16 shows a circuit schematic of an inductivity against ground ("shunt L"). FIG. 17 shows the impedance behavior of the network in FIG. 16 for varying inductance values between 1 nH and 10 nH. For a very small inductance (L≈0), the shunt inductivity substantially produces a short circuit so that the resulting input impedance (or overall impedance) of the network is at left most point (0,0) of the Smith chart, i.e., real part and imaginary part are both zero. It can be seen in FIG. 17 that a substantially different behavior is obtained, which does not appear to be of use for a pure Pi-structure, in particular when the impedance to be matched is a very small impedance. The reason is that a high-pass behavior is obtained. Accordingly, a T-structure with series capacitors and a shunt coil would be the result, as illustrated in circuit schematic form in FIG. 18. However, due to ESD problems related to the capacities, this approach is typically not further pursued.

As mentioned above, it may be difficult to match very low impedance values of the impedance to be matched. However, a transformer makes it possible to transform impedances from low to high, or vice versa, depending on the transformation ratio. When using a transformer as mentioned above for creating real-valued start values, it is possible to place the real-valued start value in such a manner that one shunt inductivity is sufficient.

Figure 19:
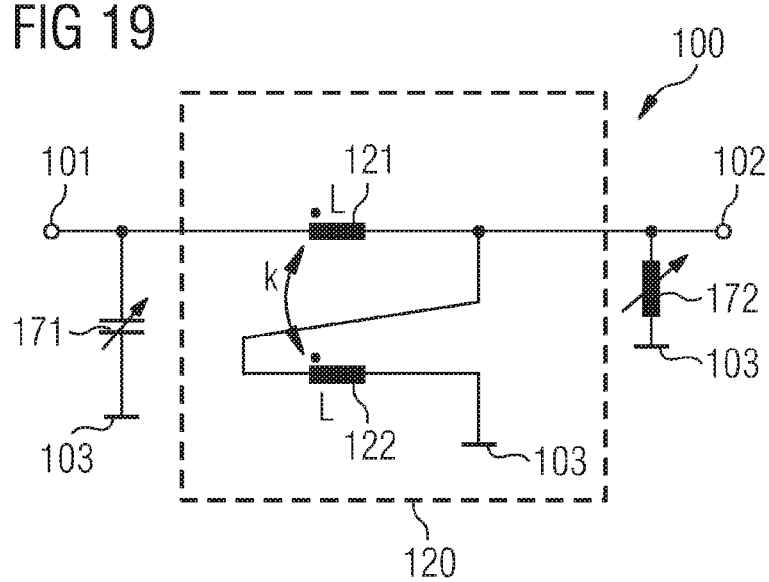
FIG. 19 shows a schematic circuit diagram of a Pi-network with a capacitive shunt branch, the first inductive path of a transmission line transformer in the series branch, and an inductive shunt branch.

FIG. 19 shows a schematic circuit diagram of a corresponding impedance matching network 100 having a transmission line transformer 120 between a capacitive shunt branch 171 and an inductive shunt branch 172. In the example of FIG. 19, it is assumed that a relatively high impedance is connected to the left side of the impedance matching network 100 (at a first terminal 101 of the impedance matching network 100), and a smaller impedance is connected to the right side of the impedance matching network 100 (at a second terminal 102 of the impedance matching network 100).

The adjustable impedance matching network 100 shown in FIG. 19 comprises a first terminal 101, a second terminal 102, and a reference potential terminal 103. In the embodiment shown in FIG. 19 the reference potential corresponds to a ground potential for the circuit 100. The circuit 100 may be connected to the reference potential at a plurality of locations via a plurality of reference potential terminals 103. An impedance $Z_L$ or $R_L$ that is to be matched to the input impedance or the output impedance of another circuit (e.g., the output impedance of a power amplifier 3 as illustrated in FIG. 3) may be connected to the first terminal 101 or the second terminal 102. The other circuit is then connected to the second terminal 102 or the first terminal 101, respectively.

The adjustable impedance matching network 100 also comprises a transmission line transformer 120. The transmission line transformer 120 comprises a series inductance (first inductor path) 121 and a ground path inductance (second inductor path) 122 which are magnetically coupled (coupling coefficient k). The series inductance 121 forms (or is part of) a first inductor path of the transmission line transformer 120. The ground path inductance 122 forms (or is part of) a second inductor path of the transmission line transformer 120. The transmission line transformer 120 is connected as a Ruthroff transformer in the embodiment shown in FIG. 11. In alternative embodiments the transmission line transformer could be connected as a Guanella transformer. The first inductor path 121 is connected to the first terminal 101 at one of its ends and to the second terminal 102 at its other end. The ground path inductance or second inductor path 122 is conductively couplable between the first input terminal 101 and the reference potential terminal 103, as will be described in more detail below. In an alternative embodiment, the first inductor path 121 could be conductively couplable between the first terminal 101 and the second terminal 102 in a reconfigurable manner, as well. In particular, the first inductor path 121 could be connected with reversed polarity. Note that the polarity of the first inductor path 101 and the second inductor path 102 has to be considered, due to the magnetic coupling of the first and second inductor paths 101, 102. This means that the transmission line transformer 120 exhibits different behaviors when one of the first and second inductor paths 101, 102 is connected with reversed polarity.

Figure 20:
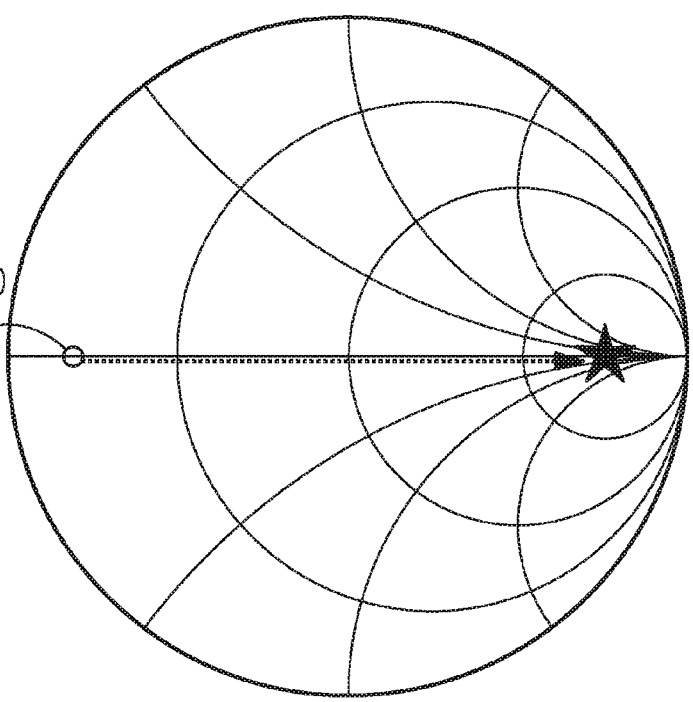
FIG. 20 illustrates in the Smith chart the effect of adjusting the real part of the impedance using the transmission line transformer.
Figure 21:
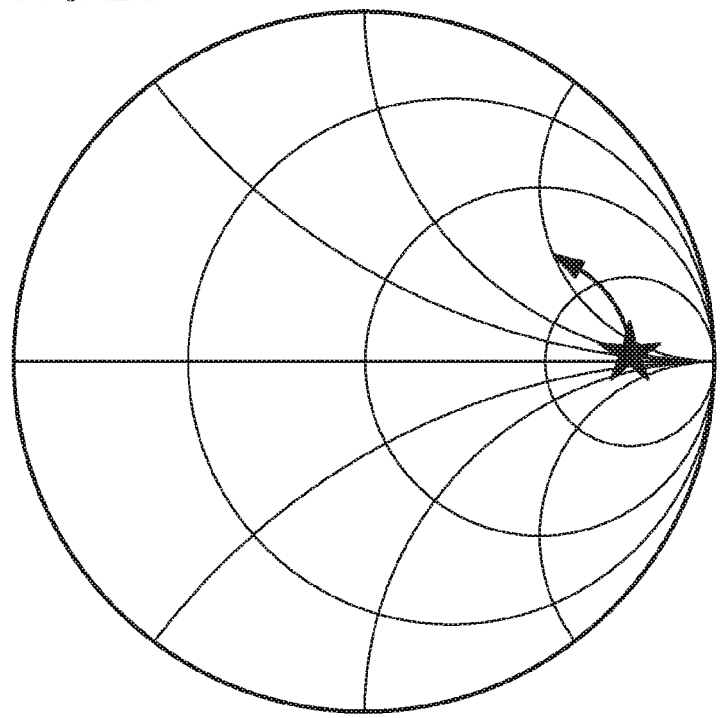
FIG. 21 illustrates in the Smith chart the effect of adjusting an inductive imaginary part of the impedance using the inductive shunt branch.
Figure 22:
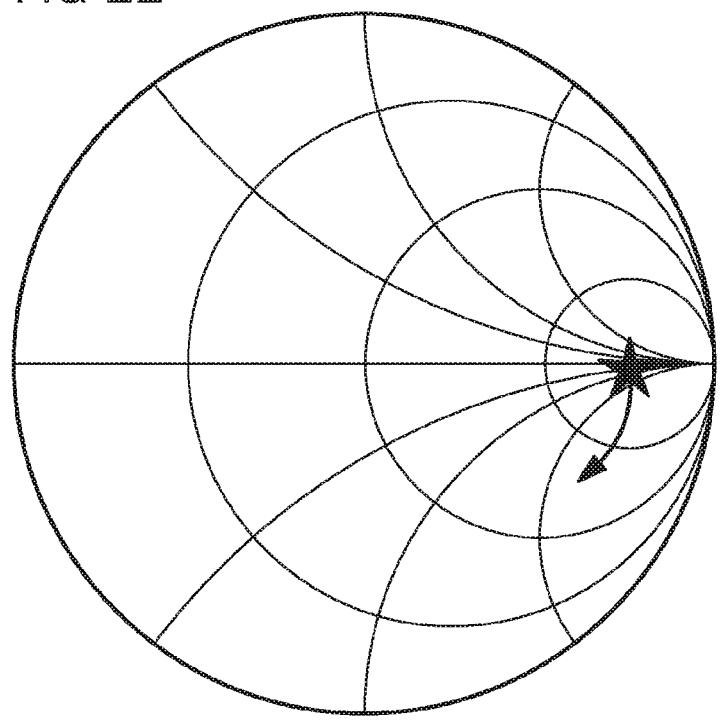
FIG. 22 illustrates in the Smith chart the effect of adjusting a capacitive part of the impedance using the capacitive shunt branch.

FIGS. 20 to 22 schematically illustrate a procedure for adjusting (matching) an impedance. FIG. 20 illustrates a step of adjusting the real part of the impedance using the transmission line transformer. The impedance to be matched has a relatively small real part. The arrow and the start in FIG. 20 represent the result of the transformation performed by the transmission line transformer.

In FIG. 21, the result of an activation of the shunt-L 172 in FIG. 19 is illustrated in the Smith chart. In an inverse manner, FIG. 22 shows the influence of a capacitive impedance based on a capacitor bank in the capacitive shunt branch 171. It can be seen that using this methodology, only shunt element are needed in addition to the (switchable) transformer. Conveniently, the inductive shunt branch 171 also provides an ESD protection in case the secondary winding 122 of the transformer 120 is not used for some reason.

It appears reasonable to design such a shunt inductivity as a coil with taps in order to coarsely obtain the necessary inductivity, and then to perform a fine tuning with the capacitor bank in the capacitive shunt branch 171, so that no significant loss of quality factor occurs. FIG. 23 shows a schematic top view of an inductive element 372 that may be used within the inductive shunt branch 172. The inductive element 372 comprises a first terminal 372a and a second terminal 372f. Furthermore, the inductive element 372 comprises a plurality of taps 372b, 372c, 372d and 372e.

FIG. 24 shows a schematic circuit diagram of the inductive element 372 and a plurality of switch elements 472b, 472c, and 472d that are connected to the taps 372b, 372c, and 372d (tap 372e is not shown in FIG. 24). Each of the switch elements 472b, 472c, 472d is configured to selectively connect the corresponding tap 372b, 372c, 372d with the ground potential. In other words, the inductive element 172 comprises a coil 372 with a tap 372b, and a switching element 472b connected to the tap 372b and configured to selectively bypass a second inductive portion that extends (in an electrical sense) along the inductive element 372 between the tap 372b and the reference potential terminal 103.

The inductive element 372 may comprise a first inductive portion, a second inductive portion connected in series with the first inductive portion, and a switching element 472b connected to a circuit node (e.g., tap 372b) between the first inductive portion and the second inductive portion and configured to selectively connect the circuit node 372b with the reference potential.

Figure 25:
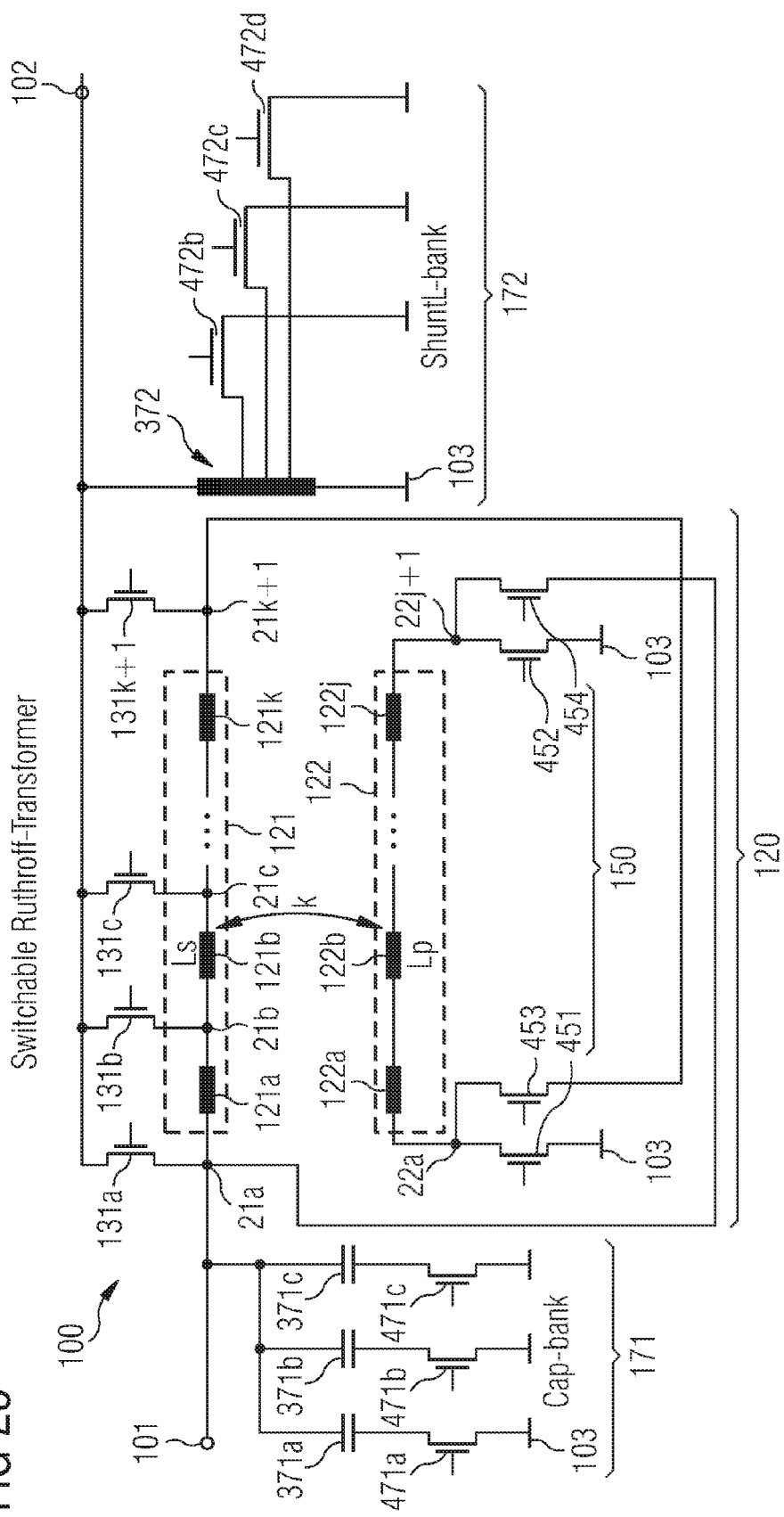
FIG. 25 shows a schematic circuit diagram of a Pi-network with capacitive shunt branch, Ruthroff transformer with adjustable transmission ratio in the series branch of the Pi-network, and inductive shunt branch.

FIG. 25 shows a schematic circuit diagram of an impedance matching network 100 according to at least some embodiments. The impedance matching network 100 of FIG. 25 can be regarded as a combination of the elements described above.

The series inductance 121 of the transmission line transformer 120 comprises a plurality of sub-sections 121a, 121b, . . . 121k. Each sub-section of the plurality of sub-sections 121a . . . 121k extends between two inductor nodes of a plurality of inductor nodes 21a, 21b, . . . 21k, 21k+1. The second inductor path 122 also comprises a plurality of sub-sections 122a, 122b, . . . 122j and corresponding inductor nodes 22a to 22j+1. The number of sub-sections of the first inductor path 121 may be equal to the number of sub-sections of the second inductor path 121, i.e., j=k. According to some embodiments however, the first and second inductor paths 121, 122 may have different numbers of sub-sections, i.e., j≠k.

The adjustable impedance matching network 100 also comprises a plurality of switching elements 131a, 131b, . . . 131k+1. The switching elements 131a . . . 131k+1 are connected between a circuit node to the left of a corresponding sub-section 121a to 121k and to the second terminal 102 (i.e., for example, the switching element 131a is connected between the circuit node to the left (with respect to FIG. 25) of sub-section 121a and the second terminal 102). Each switching element 131a . . . 131k+1 may be a semiconductor switching element. Each of the plurality of switching elements 131a . . . 131k+1 may bridge one or more sub-sections 121a . . . 121k of the first inductor path 121 when the switching element is controlled to be in a conducting state by means of a suitable control signal. In particular, the entire first inductor path 121 may be bridged when the switching elements 131a is conducting so that the first terminal 101 and the second terminal 102 are connected via the semiconductor switching element 131a.

The adjustable impedance matching network 100 shown in FIG. 25 further comprises a reconfiguration unit 150 that may be used to configure the adjustable impedance matching network 100 according to at least two different configurations. In a first possible configuration a first end (coinciding with node 22j+1 in the embodiment shown in FIG. 25) of the second inductor path 122 is connected to the first terminal 101, and a second end (coinciding with inductor node 22a) of the second inductor path 122 is connected to the reference potential terminal 103. In a second possible configuration the first end (i.e., inductor node 22j+1) of the second inductor path 122 is connected to the reference potential terminal 103 and the second end (i.e., inductor node 22a) of the second inductor path 122 is connected to the first terminal 101. Thus, in the first configuration the transmission line transformer 120 is connected as a Ruthroff transformer according to FIG. 9. In the second configuration the transmission line transformer 120 is connected as a Ruthroff transformer according to FIG. 13. As explained in connection with FIG. 13, the impedance transformation ratio can be changed, for example from a 1:4 impedance transformation ratio to a 4:1 impedance transformation ratio, by changing from the first configuration to the second configuration.

The reconfiguration unit 150 comprises switching elements 451, 452, 453, and 454. The switching elements may be transistors, e.g., MOSFETs, NMOS transistors, etc. The transistors 451 and 453 provide the functionality of a changeover switch. The transistors 452 and 454 provide the functionality of another changeover switch 152. The transistors 451 and 452 are connected to the inductor node 22a of the second inductor 122, and, at their respective opposite sides, to the reference potential and the second terminal 102, respectively. The transistors 453 and 454 are connected to the inductor node 22j+1 of the second inductor 122, and, at their respective opposite sides, to the reference potential and the first terminal 101, respectively.

The reconfiguration unit 150 may also be regarded or used as a pole reversal element that is configured to reverse a polarity of the first inductor path 121 or the second inductor path 122. When used as a pole reversal element for the first inductor path 121, the common terminals of the two changeover switches 151, 152 would be connected to the first inductor node 21a and the second inductor node 21k+1 of the first inductor path 121. The other terminals of the two changeover switches 151, 152 would then be connected to the first terminal 101 and the second terminal 102.

The adjustable impedance matching network 100 of FIG. 25 also comprises a capacitive shunt branch 171 and an inductive shunt branch 172. The capacitive shunt branch 171 comprises a bank of parallel, individually switchable capacitors 371a, 371b, 371c and a plurality of further (semiconductor) switching elements 471a, 471b, 471c. In this manner, the capacitive shunt branch 171 is variable or adjustable. The capacitive shunt branch 171 is connected in parallel to the remainder of the adjustable impedance matching network 100 between the first terminal 101 and the reference potential terminal 103. The inductive shunt branch comprises the adjustable inductive element 372 and the switching elements 472b, 472c, 472d illustrated in FIG. 24.

The adjustable impedance matching network 100 forms a Pi-network with the capacitive shunt branch 171 and the inductive shunt branch 172 being the parallel impedances.

The first inductor path 121 of the Ruthroff transformer 120 forms a series impedance or series element of the Pi-network.

The transmission line transformer 120 may be a classical transformer, a bifilar transformer or a planar transformer. In the case of a planar transformer it may be implemented as a printed circuit board integrated transformer, semiconductor transformer, redistribution layer technologies (EWLB—Embedded Wafer Level Ball Grid Array), a LTCC structure, a HTCC structure, or a combination thereof.

As a further option for adjustment, the series inductance $L_s$ could be designed to be unequal to the parallel inductance $L_p$, and/or the parallel inductivity $L_p$ could be made switchable, as well (not shown in FIG. 25). For example, the parallel inductivity $L_p$ could be made switchable with respect to its inductance value by commutating between a series connection and a parallel connection of the sub-sections 122a to 122j of the second inductor path. This would make the range of possible transformation ratios larger so that additional real values in the complex plane may be reached.

Following the above, it is proposed to not employ known T-networks or Pi-networks, but to use a transformer instead and to implement its transformation ratio in at least one sub-section of its winding. Thus, a number of benefits can be achieved:

Lower losses/insertion loss when using equivalent components.

Larger bandwidth and thus less sensibility to production tolerances.

Usable for several frequency bands; a transformer can handle the 900 MHz band as well as the 1.8 GHz band, whereas a Pi-structure according to FIG. 5 would require two different inductivities (which may be achieved using a switch, but this would require an additional switch and thus leads to additional losses).

A ground connection is always provided via the second inductor path so that the capacitances (if present) are better protected against electrostatic discharge (ESD).

As the switching elements (e.g., switching transistors) only see a small portion of the voltage swing, devices having a lower breakdown voltage may be used: devices with smaller on-resistance $R_{on}$ and/or off-capacitance $C_{off}$ may be used.

The inductive part is adjusted using a shunt inductivity which contributes less losses, because "only" it influences the reactive component.

The switching elements 131a to 131k+1, 471a to 471c, 472b to 472d, and 451 to 454 may be implemented as CMOS transistors, typically NMOS transistors.

Figure 18:
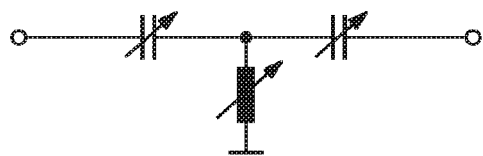
FIG. 18 shows a schematic circuit diagram of a T-network with series capacitors and shunt inductor.
Figure 26:
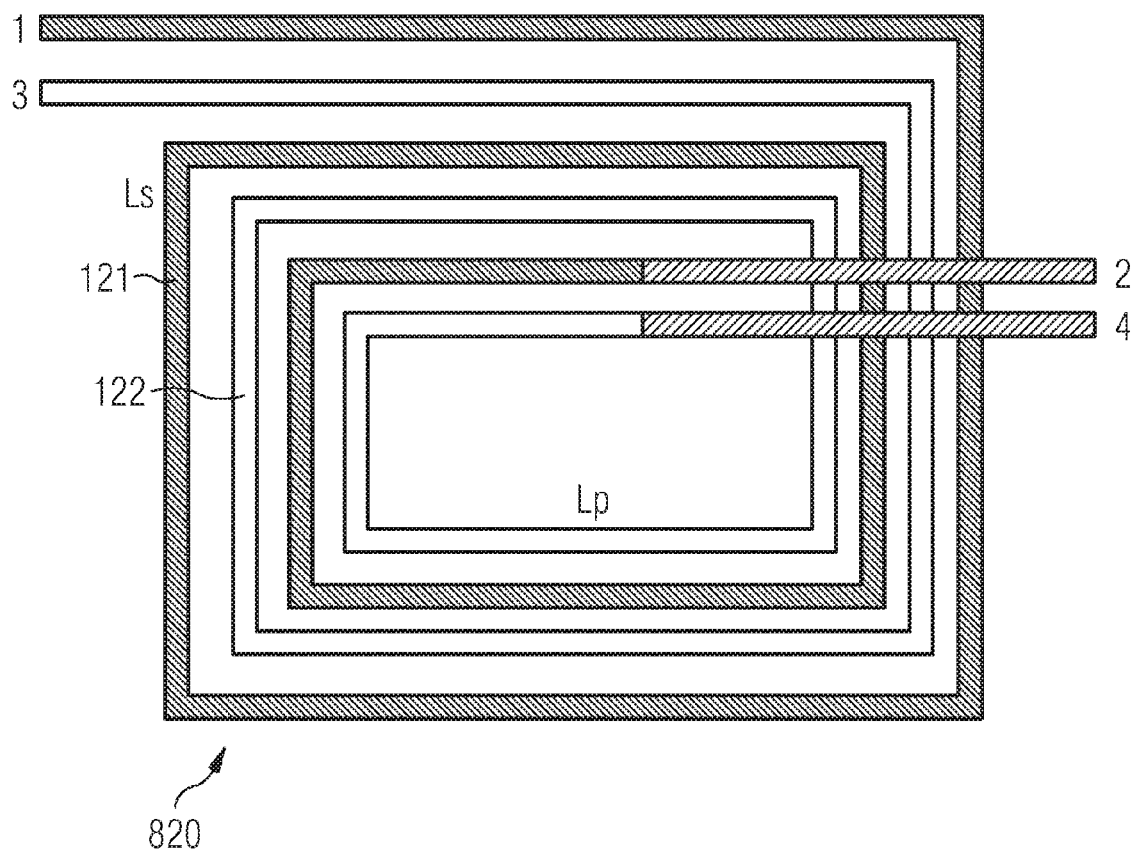
FIG. 26 shows a schematic top view of a transmission line transformer that may be used, e.g., in the Pi-network of FIG. 24.

FIG. 26 shows in a schematic manner a top view of a planar transmission line transformer 820. In general, the transmission line transformer may be realized in a passive integration or, alternatively, accommodated in a laminate (e.g., a printed circuit board), as a LTCC or HTCC (low/high temperature co-fired ceramic) structure, etc. Other implementations of the transmission line transformer are also possible, such as a transformer integrated in a silicon substrate or EWLB (Embedded Wafer Level Ball Grid Array). The transmission line transformer 820 comprises the first inductor path 121 and the second inductor path 122. The first inductor path 121 extends between the terminals numbered 1 and 2 in FIG. 18. The second inductor path 122 extends between the terminals numbered 2 and 4 in FIG. 18. In other configurations, the transmission line transformer may comprise a third inductor path and possibly even further inductor paths. When using a planar transformer 820 as shown in FIG. 18, the transformer 820 may be tapped at suitable locations in order to obtain the desired impedance switching ratio.

The capacitive element or shunt branch 171 and the inductive element or shunt branch 172 may both be adjustable. The capacitive element 171 may have a finer adjustment resolution than the inductive element 172.

The capacitive element 171, the inductive element 172, and the transmission line transformer 120 may be integrated monolithically within an integrated circuit. Alternatively, the transmission line transformer may be formed within a laminate module.

As already mentioned above in the description relative to FIGS. 5 and 7, covering a large frequency concurrently with a covering a large impedance region presents a challenge for the design of impedance matching networks. For example, frequencies between 700 MHz and 2.69 GHz have to be taken into account in mobile phones.

When designing the series inductivity for the lowest frequency (typically resulting in the highest inductance value), depending on the specification of the adjustment region to be reached, one ends up with an inductance of 22 nH. In particular high impedance values (≈500 ohm) require such inductance values. When the same impedance has to be reached (i.e., matched) at 2.69 GHz, the series inductivity may be substantially smaller, namely approximately 3 nH. Hence, the inductance has to be reduced significantly in an impedance matching network having the structure shown in FIG. 7. Even when we assume an ideally adjustable capacitance, the series resistance of the series inductivity remains constant, which results in a notably reduced quality factor. Accordingly, the mobile communications device will present large losses, or it may not be possible to even be able to cover this particular region of impedances.

A similar behavior can be observed with adjustable capacities: at 700 MHz relatively large capacitance values are necessary, whereas at 2.69 GHz only small capacitance values are needed. Once more, given a substantially constant real part of the impedance, the reduction of the imaginary part of the impedance inevitably causes a reduction of the quality factor. For this reason, only technologies are used for these matching circuits that provide the highest possible quality factor. Furthermore, the allowable frequency range may also be limited.

Figure 27:
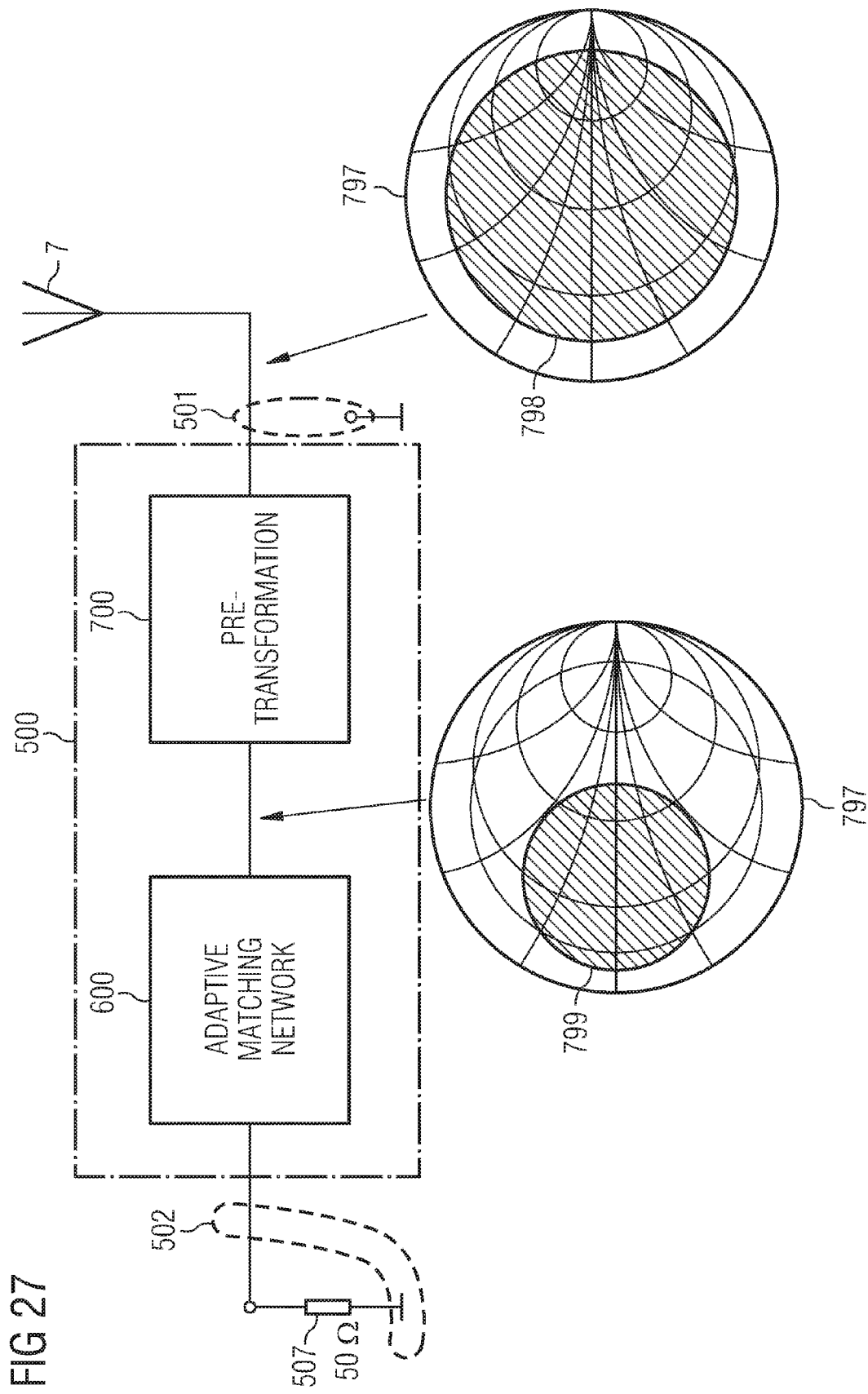
FIG. 27 shows a schematic block diagram of a frontend system comprising an impedance matching network with pre-transformation.

FIG. 27 relates to a concept for an adaptive matching circuit with pre-transformation. FIG. 27 shows a schematic block diagram of a frontend system of a wireless communications device comprising an impedance matching network 500 that uses a pre-adjustment or pre-transformation 700 in order to exclude certain regions of the possible impedance values before the impedance is passed on to an adaptive matching network 600, for example, a Pi-network. More precisely, the proposed impedance network 500 comprises a first port 501 and a second port 502. The impedance matching network further comprises a transformer 700 configured to transform an impedance (e.g., the impedance of the antenna 7) connected to the first port 501 so that a corresponding transformed impedance lies within a confined impedance region 799 in a complex impedance plane 797. The impedance matching network 500 also comprises an adaptive matching network that is adjustable to match the transformed impedance located anywhere within the confined impedance region to a second impedance 507 connected to the second port 502.

Figure 28:
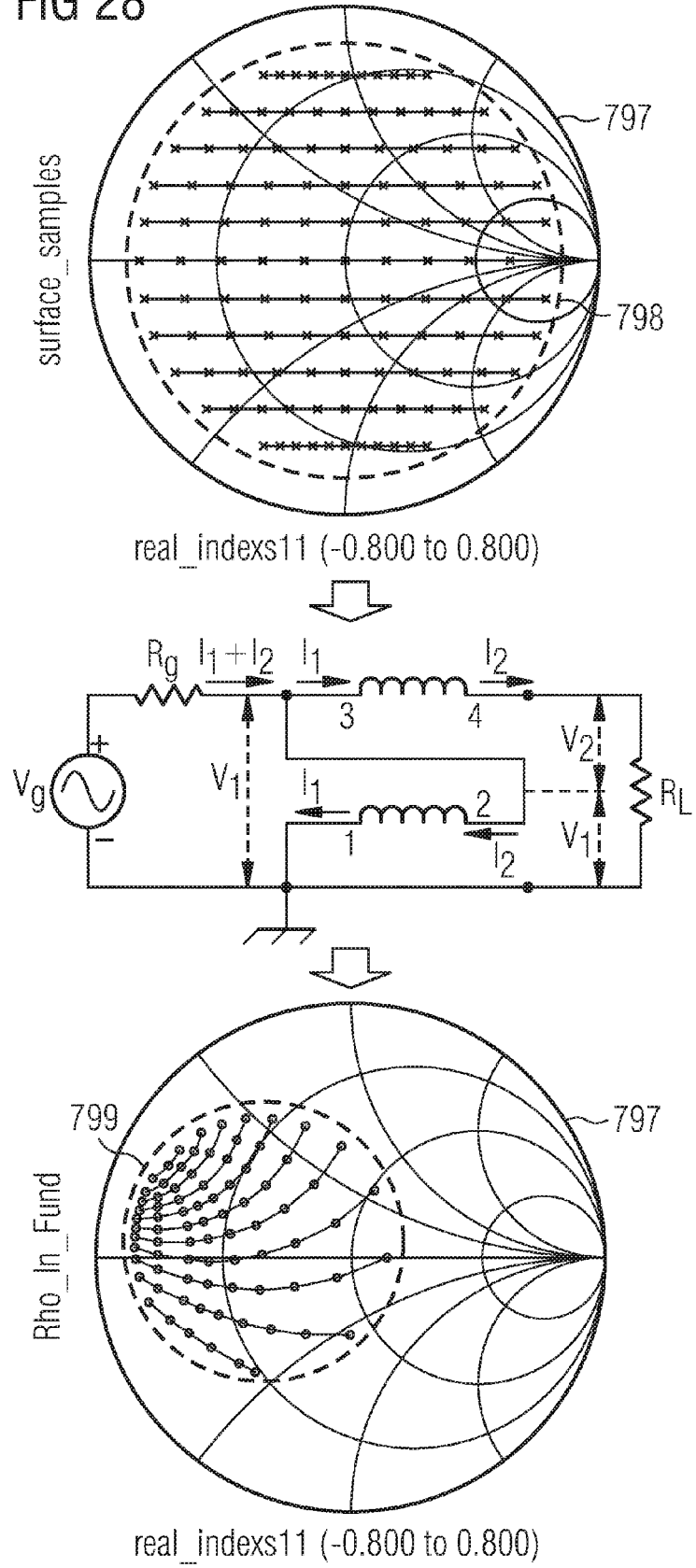
FIG. 28 illustrates how a confined original impedance region is transformed to a confined impedance region by the pre-transformation.

FIG. 28 shows the result of a simulated example. The simulation was performed for a frequency of 850 MHz as a field simulation of a planar transformer in CMOS technology. The upper part of FIG. 28 shows a Smith chart representing a complex impedance plane 797. Referring to FIG. 27, the antenna 7 may offer a plurality of different impedances, depending on environmental influences, operating conditions, etc. The plurality of impedances offered by the antenna 7 are located within a confined original impedance region 798. The confined original impedance region 798 has the shape of a circle, but this is not required. Without loss of generality, it is assumed that the impedance at the second port 502 corresponds to the point (1,0) in the complex impedance plane 797, i.e., the center of the circular confined original impedance region 798. Impedances that are represented by points close to the center (1,0) of the circle 798 are matched already in a relatively good manner. Points that are far away from the center of the circle 798 correspond to relatively badly matched impedances. The confined original impedance region 798 is confined, or bounded, which means that theoretically there may be impedance values that are outside the confined original region. However, these outlying impedance values are not expected to occur in practice, or at least only very seldom.

It can be seen in FIG. 28 that the pre-transformation masterfully shrinks the impedance region. Due to the large bandwidth of the Ruthroff transformer, the result substantially looks the same at high frequencies (2 GHz). In order to match this reduced region, substantially smaller inductance values are necessary (approximately 3 nH at 800 MHz). In addition, these smaller inductivites can be implemented in a monolithic manner much easier.

As a result, one obtains a smaller insertion loss and also benefits from the large bandwidth of the transformer. This means that globally the bandwidth is improved.

The underlying principle is the use of a six interposed pre-transformation in order to limit the possible VSWR region/impedance region. In this manner, a simplified adaptive matching network can be obtained which requires less extreme boundary conditions, or becomes suitable for monolithic integration in the first place.

With respect to the pre-transformation, a number of options exist. For example, a pi-network is imaginable, at higher frequencies a λ/4 transformer, a transducer, and the transmission line transformers already mentioned for this purpose. The Guanella transformer and the Ruthroff transformer are transmission line transformers. Although the Guanella transformer and the Ruthroff transformer historically come from macroscopic transformers with bifilar windings, they may also be implemented in principle as planar transformers on laminate or silicon. As an example, FIG. 9 shows a Ruthroff transformer as 1:4 impedance transformer, for which two identical inductivities are assumed.

The basic idea of these transformers is the combination of signal portions in an additive manner. In the case illustrated in FIG. 9, the output voltage is a sum of the voltage V2 across the series inductance and of the voltage V1 across the ground path. At the same time, the electric current is split up over the two inductances so that, due to a doubling of voltage and a halving of the electric current, an impedance transformation of 1:4 is achieved ($R_L$ appears to be more high-ohmic to the voltage source $V_g$).

In general, the transformer-based solution has some advantages over a Pi-Network-based solution:
Insertion loss
Bandwidth
ESD robustness Reference is made to FIGS. 5, 6, 10 and 11 for a comparison of a classical pi-network and a pi-network with a transmission line transformer.

When applying an impedance located within the confined original impedance region 798 to the transformer 700, the impedance is transformed according to the transformation ratio. When the transformation ratio is appropriately chosen, this leads to the confined original impedance region 798 to be compacted to the smaller confined impedance region 799, which is illustrated in the lower part of FIG. 28. In other words, the impedance connected to the first port 501 may be located within the confined original impedance region 798 in the complex impedance plane 797 that is larger than the confined impedance region 799. Note that the confined original impedance region 798 leaves out an outer ring of the complex impedance plane 797, because this outer ring contains extreme impedance values that are either very small or very large.

The confined impedance region 799 may be a function of the capabilities of the adaptive matching network 600. In other words, when the set of impedances is known that can be matched using the adaptive matching network 600, this defines the confined impedance region 799. The confined original impedance region 798 may be determined on the basis of the confined impedance region 799 using the transformation ratio of the pre-transformer 700.

The transformer 700 may have a fixed transformation ratio. The transformer 700 may be a transmission line transformer.

After the pre-transformation performed by the transformer 700, the new impedance region has to be matched to the target impedance in a next step. Basically, a structure as schematically illustrated in FIG. 5 or 18 may be employed to this end. However, in order to not limit the bandwidth by performing this matching (which is needed for broadband LTE signals, for example), it may be advisable to perform a multistage matching, as schematically illustrated by a multistage pi-network as shown in FIG. 8.

Figure 29:
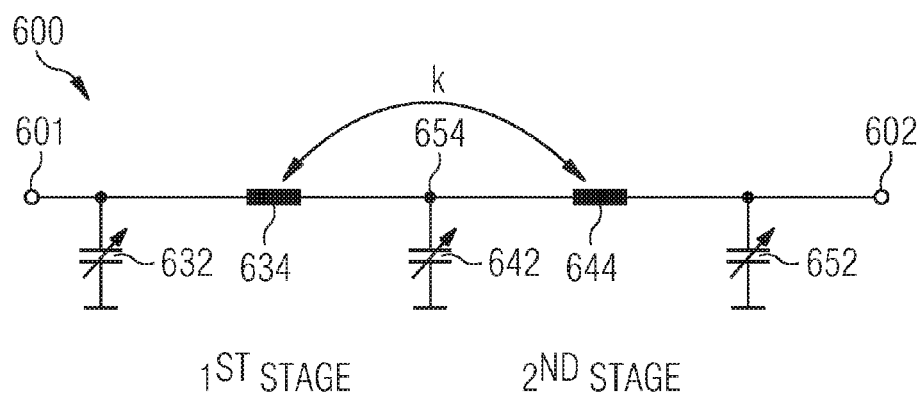
FIG. 29 shows a schematic circuit diagram of a multistage adaptive matching network that may be used together with the transformer performing the pre-transformation.

Instead of using two coils as shown in FIG. 8, it may be even more advisable to use a single coil having a tap because in this manner the coupling between the inductivities can be exploited, as well. FIG. 29 shows a schematic circuit diagram of a corresponding adaptive matching network 600 according to some embodiments. The adaptive matching network 600 is a two-stage Pi-network and comprises a first terminal 601 and a second terminal 602. The first terminal six of one and the second terminal six and two are connected by a series connection of a first inductive element 634 and a second inductive element 644. In the embodiment shown in FIG. 29 the first and second inductive elements 634, 644 are inductively coupled as indicated by the coupling factor k. It may be beneficial to exploit the coupling between the first and second inductive elements. This may be achieved by using a single coil that has a tap 654. In other embodiments it is also possible that the first inductive element 634 and the second inductive element 644 are implemented as two different coils having no or only negligible inductive coupling. The adaptive matching network 600 shown in FIG. 29 further comprises three adjustable capacitance elements 632, 642 and 652.

The adaptive matching network 600 may comprise a Pi-network having a series inductance 634 and shunt capacitances 632, 642. According to some embodiments, the adaptive matching network 600 may comprise at least two stages. The adaptive matching network 600 may comprise a series inductance 634, 644 with an intermediate tap 654 and a capacitive element 642 connected to the intermediate tap.

The series inductance may comprise a first inductive portion associated to a first stage of the at least two stages, and a second inductive portion associated to a second stage, the second inductive portion being inductively coupled to the first inductive portion.

The adaptive matching network 600 may comprise a first adjustable capacitive shunt branch and a second adjustable capacitive shunt branch.

The adaptive matching network 600 may comprise a fixed inductance and an adjustable capacitive element.

Figure 30:
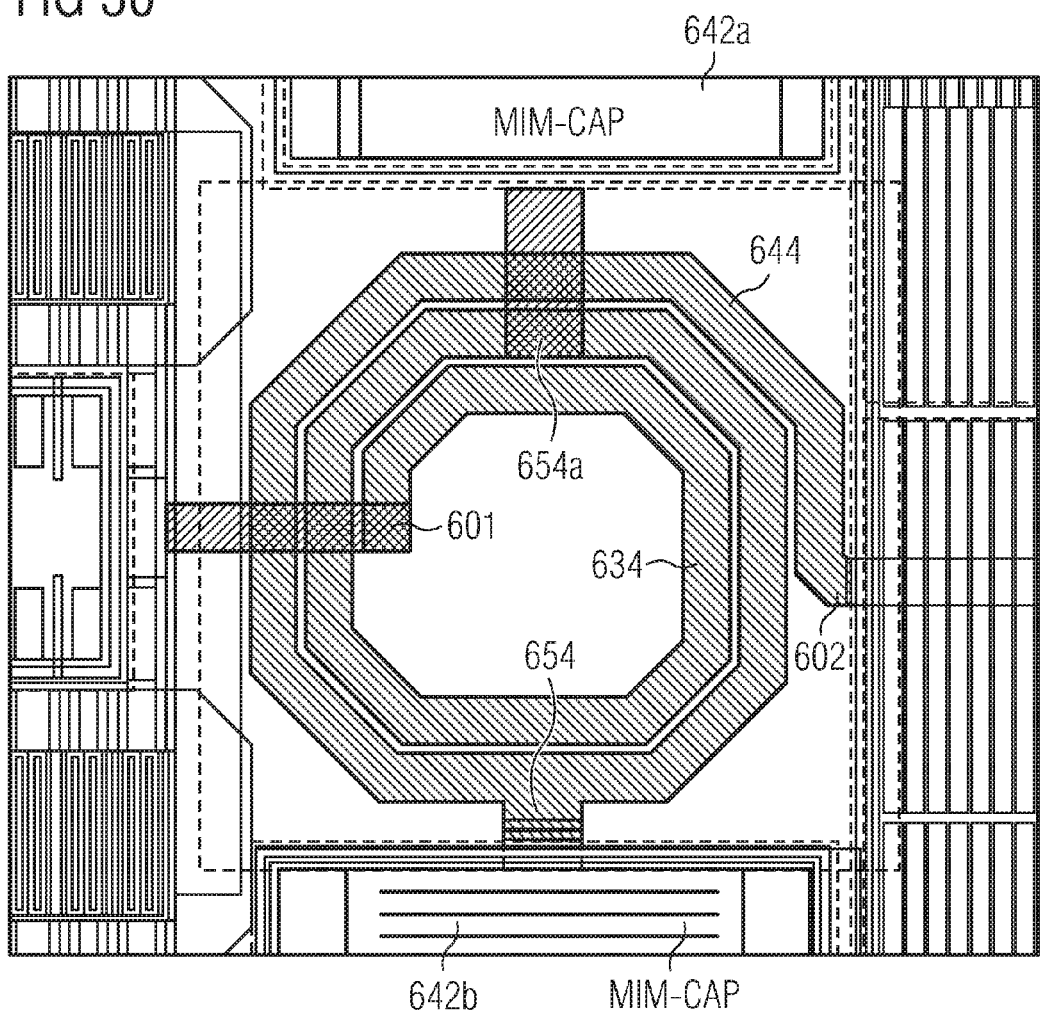
FIG. 30 schematically illustrates the chip layout of an inductive element usable as the series inductive elements in the multistage adaptive matching network of FIG. 28, the inductive element having two inductive portions and an intermediate tap.

FIG. 30 shows as an example of a schematic chip layout of the two coupled inductive elements 634 and 644, as well as to capacitive elements 642a and 642b connected to taps 654a and 654b, respectively. The coil shown in FIG. 30 differs from the schematic circuit diagram in FIG. 29 in that the coil comprises two taps 654a, 654b. The capacitive elements 642a and 642b are implemented as metal-insulator-metal capacitors.

FIG. 31 shows a schematic circuit diagram of the impedance matching network 500 comprising the transformer 700 and the adaptive impedance matching network 600.

An antenna circuit according to further embodiments may comprise an antenna 7 (see for example FIG. 3), a signal terminal configured to relay a signal to a receiver or from a transmitter (in FIG. 3 for example the output of the antenna switch 5) and an impedance matching network interconnecting the antenna 7 and the signal terminal. Departing from FIG. 3, the impedance matching network comprises a Pi-network having a first inductor path of a transmission line transformer in a series branch of the Pi-network. As an alternative, an antenna circuit according to further embodiments may comprise the antenna 7, the signal terminal, and an impedance matching network as schematically illustrated in FIG. 31.

FIG. 32 shows a schematic flow diagram of a method for matching an impedance using an impedance matching network comprising a first shunt branch with a capacitive element, a second shunt branch with an inductive element, and a transmission line transformer with a first inductor path and a second inductor path, wherein the first inductor path connects the first terminal and the second terminal. The method comprises a step 902 of adjusting a real part of the impedance by adjusting a transmission ratio of the transmission line transformer. The method further comprises a step 904 of adjusting an imaginary part of the impedance by adjusting at least one of the capacitive element and the inductive element.

The step 902 of adjusting the transmission ratio of the transmission line transformer may comprise controlling a switching element that is connected in parallel to a sub-section of the first inductor path or of the second inductor path, in order to selectively bridge the sub-section and to adjust the inductance of the first inductor path or the second inductor path.

The step 904 of adjusting the imaginary part of the impedance may comprise performing a coarse adjustment by adjusting the inductive element. Subsequently, a fine adjustment by adjusting the capacitive element may be performed.

The step 904 of adjusting the inductive element may comprise controlling a further switching element connected to a tap of the inductive element, the tap being connected to a node between a first inductive portion and a second inductive portion of the inductive element, in order to selectively bypass the second inductive portion of the inductive element.

FIG. 33 shows a schematic flow diagram of a method for matching an impedance. The impedance to be matched is connected to a first port of an impedance matching network. The method comprises a step 952 of transforming the impedance to a corresponding transformed impedance that lies within a confined impedance region in a complex impedance plane. Said transforming is performed by a transformer of the impedance matching network. The method further comprises a step 954 of matching the transformed impedance located anywhere within the confined impedance region to a second impedance connected to a second port of the impedance matching network, wherein said matching is performed by an adaptive matching network.

The impedance connected to the first port may typically be located within a confined original impedance region in the complex impedance plane that is larger than the confined impedance region.

The adaptive matching network may comprise at least one of an adjustable capacitive element and an adjustable inductive element. Matching the transformed impedance to the second impedance may comprise adjusting the adjustable capacitive element or the adjustable inductive element.

The step 954 of adjusting the adjustable capacitive element or the adjustable inductive element may comprise controlling a switching element to selectively engage or disengage a particular inductive portion of the adjustable inductive element, or a particular capacitive portion of the adjustable capacitive element.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

In the foregoing Detailed Description, it can be seen that various features are grouped together in embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Furthermore, in some embodiments a single step may include or may be broken into multiple sub steps. Such sub steps may be included and part of the disclosure of this single step unless explicitly excluded.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. An impedance matching network comprising:
   a first port;
   a second port; and
   an adaptive matching network connected between the first port and the second port,
   wherein the adaptive matching network comprises at least two stages,
   wherein the adaptive matching network comprises a series inductance with an intermediate tap and a capacitive element connected to the intermediate tap,
   wherein the series inductance comprises a first inductance associated with a first stage of the at least two stages and a second inductance associated with a second stage,
   wherein the first inductance and the second inductance form a transmission line transformer,
   wherein the series inductance is located in a first inductor path of a series branch of the adaptive matching network, and
   wherein the first inductance and the second inductance are inductively coupled.

2. The impedance matching network according to claim 1, wherein the transmission line transformer has a fixed transformation ratio.

3. The impedance matching network according to claim 1, wherein the adaptive matching network is a Pi-network.

4. The impedance matching network according to claim 3, wherein the Pi-network comprises the series inductance and shunt capacitances.

5. The impedance matching network according to claim 1, wherein the adaptive matching network comprises a first adjustable capacitive shunt branch and a second adjustable capacitive shunt branch.

6. The impedance matching network according to claim 1, wherein the series inductance comprises a fixed inductance, and wherein the capacitive element is an adjustable capacitive element.

7. The impedance matching network according to claim 1, wherein the transmission line transformer comprises a second inductor path that is a ground path, and wherein the first inductor path and the second inductor path are magnetically coupled.

8. The impedance matching network according to claim 1, wherein the transmission line transformer is a Ruthroff transformer.

9. The impedance matching network according to claim 1, wherein the transmission line transformer is a Guanella transformer.

10. An antenna circuit comprising:
    an antenna;
    a signal terminal configured to relay a signal to a receiver or from a transmitter; and
    an impedance matching network interconnecting the antenna and the signal terminal and comprising a Pi-network having a transmission line transformer, wherein the transmission line transformer includes a first inductance and a second inductance, wherein the first inductance is located in a first inductor path of a series branch of the Pi-network, and wherein the first inductance and the second inductance are inductively coupled.

11. A method for operating an impedance matching network comprising a first port, a second port and an adaptive matching network connected between the first port and the second port, wherein the adaptive matching network comprises a transmission line transformer having a first inductance and a second inductance, wherein the first inductance is located in a first inductor path of a series branch of the adaptive matching network, wherein the first inductance and the second inductance are inductively coupled, and wherein the adaptive matching network is a Pi-network, the method comprising:
    matching a first impedance connected to the first port of the impedance matching network and a second impedance connected to the second port of the impedance matching network.

12. The method according to claim 11, wherein the adaptive matching network comprises at least one of an adjustable capacitive element or an adjustable inductive element, and wherein matching a transformed impedance to the second impedance comprises adjusting the adjustable capacitive element or the adjustable inductive element.

13. The method according to claim 12, wherein adjusting the adjustable capacitive element or the adjustable inductive element comprises controlling a switching element to selectively engage or disengage a particular inductive portion of the adjustable inductive element, or a particular capacitive portion of the adjustable capacitive element.

14. An impedance matching network comprising:
    a first port;
    a second port; and
    an adaptive matching network connected between the first port and the second port,
    wherein the adaptive matching network comprises a transmission line transformer having a first inductance and a second inductance,
    wherein the first inductance and the second inductance are inductively coupled,
    wherein the first inductance is located in a first inductor path of a series branch of the adaptive matching network,
    wherein the second inductance is located in a second inductor path which is a ground path, and
    wherein the first inductor path and the second inductor path are magnetically coupled.

15. The impedance matching network according to claim 14, wherein the adaptive matching network is a Pi-network.

16. The impedance matching network according to claim 15, wherein the Pi-network comprises a series inductance and shunt capacitances.

17. The impedance matching network according to claim 14, wherein the adaptive matching network comprises a fixed inductance and an adjustable capacitive element.

18. The impedance matching network according to claim 14, wherein the first inductor path and the second inductor path of the transmission line transformer have the same polarity.

19. The impedance matching network according to claim 14, wherein the second inductor path of the transmission line transformer has a reverse polarity relative to the first inductor path.

20. The impedance matching network according to claim 14, wherein the transmission line transformer is a Ruthroff transformer.

21. The impedance matching network according to claim 14, wherein the transmission line transformer is a Guanella transformer.

* * * * *